(12) United States Patent
Komori et al.

(10) Patent No.: US 7,985,605 B2
(45) Date of Patent: Jul. 26, 2011

(54) LIGHT-EMITTING DEVICE AND MANUFACTURING METHOD THEREOF

(75) Inventors: Shigeki Komori, Kanagawa (JP); Ryu Komatsu, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 163 days.

(21) Appl. No.: 12/422,470

(22) Filed: Apr. 13, 2009

(65) Prior Publication Data

US 2009/0261369 A1    Oct. 22, 2009

(30) Foreign Application Priority Data

Apr. 17, 2008   (JP) ................................. 2008-108193

(51) Int. Cl.
  *H01L 21/00*   (2006.01)
(52) U.S. Cl. .......................................... 438/22; 438/29
(58) Field of Classification Search .................... 438/22, 438/29
  See application file for complete search history.

(56) References Cited

U.S. PATENT DOCUMENTS

| | | |
|---|---|---|
| 4,409,134 A | 10/1983 | Yamazaki |
| 6,008,065 A | 12/1999 | Lee et al. |
| 6,485,997 B2 | 11/2002 | Lee et al. |
| 6,493,048 B1 | 12/2002 | Baek et al. |
| 6,635,581 B2 | 10/2003 | Wong |
| 7,223,643 B2 | 5/2007 | Ohnuma et al. |
| 2006/0290867 A1 | 12/2006 | Ahn et al. |
| 2007/0002249 A1 | 1/2007 | Yoo et al. |
| 2007/0126969 A1 | 6/2007 | Kimura et al. |
| 2007/0139571 A1 | 6/2007 | Kimura |
| 2007/0146591 A1 | 6/2007 | Kimura et al. |
| 2007/0222936 A1 | 9/2007 | Shih |

FOREIGN PATENT DOCUMENTS

| | | |
|---|---|---|
| JP | 03-011744 | 1/1991 |
| JP | 2003-179069 | 6/2003 |
| JP | 2007-133371 | 5/2007 |

OTHER PUBLICATIONS

C.W. Kim et al.; "42.1: A Novel Four-Mask-Count Process Architecture for TFT-LCDs"; *SID Digest '00 : SID International Symposium Digest of Technical Papers*; pp. 1006-1009; 2000.

*Primary Examiner* — Thanh V Pham
*Assistant Examiner* — Caleb Henry
(74) *Attorney, Agent, or Firm* — Fish & Richardson P.C.

(57) ABSTRACT

A first conductive film, a first insulating film, a semiconductor film, an impurity semiconductor film, and a second conductive film are stacked in this order (a thin-film stacked body); first etching is performed to expose the first conductive film and form at least a pattern of the thin-film stacked body; second etching is performed to form a pattern of the first conductive film. The second etching is performed under a condition in which the first conductive film is side-etched. Further, after forming the patterns, an EL layer can be formed selectively by utilizing a depression and a projection due to the patterns.

11 Claims, 22 Drawing Sheets

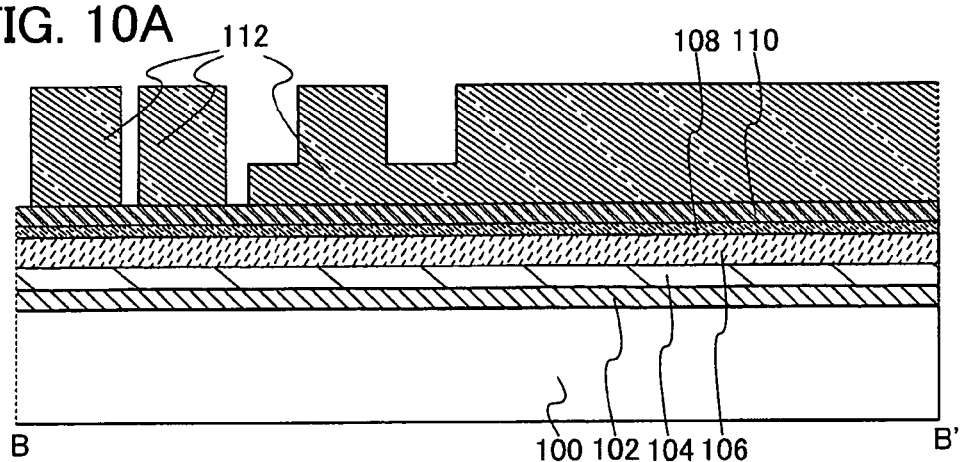
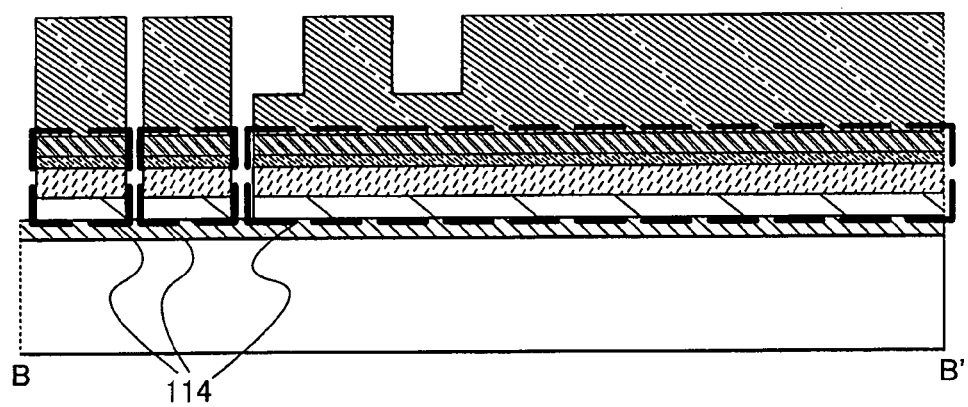
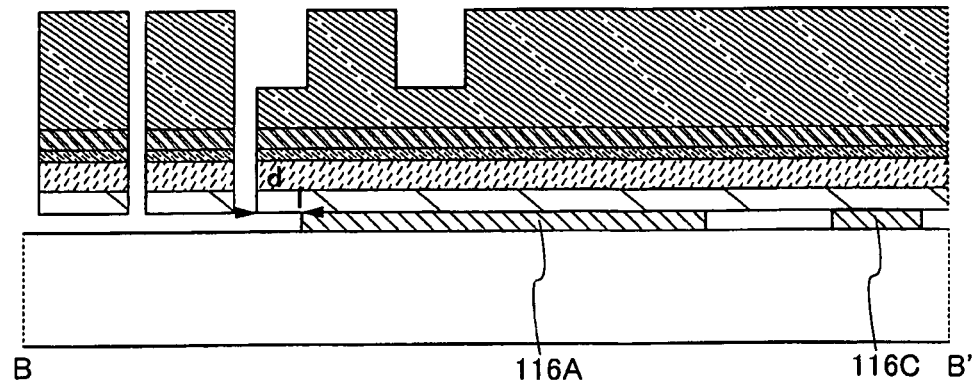

LIGHT-EMITTING DEVICE AND MANUFACTURING METHOD THEREOF

BACKGROUND OF THE INVENTION

1. Field of the Invention

The technical field relates to a method for manufacturing a light-emitting device having a thin film transistor, in particular, to a light-emitting device typified by an EL display device.

2. Description of the Related Art

In recent years, thin film transistors which include a thin semiconductor film with a thickness of several tens of nanometers to several hundreds of nanometers approximately and are formed over a substrate having an insulating surface, such as a glass substrate, have been attracting attention. Thin film transistors are widely applied to electronic devices such as integrated circuits (ICs) and electrooptic devices. In particular, prompt development of thin film transistors that are to be used as switching elements in image display devices typified by liquid crystal display devices, electroluminescent (EL) display devices, and the like is being pushed.

In an active matrix EL display device, a voltage is applied between one electrode and the other electrode, which sandwich an EL layer (including a light-emitting layer), of a light-emitting element provided in a pixel selected, whereby a current is generated in the EL layer and the light-emitting layer emits light. A viewer perceives this light emission as a display pattern. In an active matrix EL display device, pixels arranged in a matrix are driven with switching elements, thereby forming a display pattern on a screen.

The range of uses for the above active matrix EL display devices has been widening, and a larger screen, higher definition, a higher aperture ratio, and the like have been demanded. Further, higher reliability, higher productivity, lower production cost, and the like are required of active matrix EL display devices. An example of a method of enhancing productivity and reducing production cost involves a simplified process.

In an active matrix EL display device, thin film transistors are mainly used as switching elements. It is effective to reduce the number of photomasks used in photolithography in simplifying a process of manufacturing thin film transistors. For example, when one photomask is further used, steps of resist application, prebaking, light exposure, development, post-baking, and the like, steps of film formation and etching before and after the preceding steps, and further, steps of resist removal, cleaning, drying, and the like are required. Thus, even when only one photomask is additionally used in a manufacturing process, the number of steps increases significantly. As described above, a process is highly simplified or complicated depending on the number of photomasks; therefore, a number of techniques have been developed to reduce the number of photomasks in a manufacturing process.

Thin film transistors are broadly classified into top gate thin film transistors, in which a channel formation region is provided below a gate electrode, and bottom gate thin film transistors, in which a channel formation region is provided above a gate electrode. It is known that a bottom gate thin film transistor is more advantageous than a top gate thin film transistor in terms of the number of photomasks used. In general, a bottom gate thin film transistor can be manufactured using three photomasks.

With regard to conventional techniques for reducing the number of photomasks, complicated techniques such as backside light exposure, resist reflow, and lift-off are largely used, which often require a special apparatus. There have been concerns for decrease in a yield and the like due to a variety of problems caused by using such a complicated technique. Further, electric characteristics of thin film transistors have to be sacrificed in many cases.

As a typical means for reducing the number of photomasks in a process of manufacturing a thin film transistor, a technique of using a multi-tone photomask (called a "half-tone mask" or a "gray-tone mask") is widely known. For example, Reference 1 (Japanese Published Patent Application No. 2003-179069) discloses a technique to reduce the number of manufacturing steps with the use of a multi-tone photomask.

SUMMARY OF THE INVENTION

When a display device is manufactured with the use of a multi-tone photomask by the above technique, at least two multi-tone photomasks and one common photomask are necessary. In this case, further, since a metal film (a second metal film) is formed over a transparent conductive film of a display device and is removed by dry etching, the transparent conductive film is damaged, whereby a light-transmitting property of the transparent conductive film decreases; otherwise, part of the metal film remains over the transparent conductive film without being etched, thereby decreasing the light-transmitting property.

Although the above technique does not require an additional photomask in patterning a gate electrode layer, it requires a photomask in another step. Therefore, the number of photomasks cannot be reduced.

An object of a mode of the invention disclosed in this specification and the like (including at least description, claims, and drawings) lies in simplifying a process of manufacturing a thin film transistor and simplifying a method for manufacturing a light-emitting device such as an EL display device. Another object lies in providing a method for manufacturing a light-emitting device in which a characteristic of the above manufacturing method is utilized effectively.

In a mode of the invention disclosed, a first conductive film, a first insulating film, a semiconductor film, an impurity semiconductor film, and a second conductive film are stacked in this order (a thin-film stacked body); the first conductor film is exposed and at least a pattern of the thin-film stacked body is formed by first etching; a pattern of the first conductive film is formed by second etching. The second etching is performed under a condition in which the first conductive film is side-etched. Thus, the pattern formed by the first etching (the pattern of the first insulating film, the semiconductor film, the impurity semiconductor film, and the second conductive film) can be different from that formed by the second etching (the pattern of the first conductive film). Further, after forming the patterns, an EL layer can be selectively formed by utilizing a projection and a depression due to the patterns.

Since the second etching involves the side etching of the first conductive film, the first conductive film recedes inward from the patterned thin-film stacked body by the second etching. Therefore, a side face of the first conductive film which has undergone the second etching is present at an inner position with respect to that of the patterned thin-film stacked body. Further, the distance between the side face of the patterned first conductive film and that of the patterned thin-film stacked body is uniform or almost uniform.

For the first etching, either dry etching or wet etching may be performed; it is preferable to employ an etching method with high anisotropy (physical etching). By employing an etching method with high anisotropy for the first etching, the patterning accuracy can be improved. If the first etching is performed by dry etching, it involves one step, whereas if the first etching is performed by wet etching, it involves a plurality of steps. Therefore, it is preferable to employ dry etching for the first etching.

For the second etching, either dry etching or wet etching may be performed; it is preferable to employ an etching method with predominant isotropy (chemical etching). By employing an etching method with predominant isotropy (chemical etching) for the second etching, the first conductive film can be side-etched. Therefore, it is preferable to employ wet etching for the second etching.

The pattern of the first conductive film is a top layout of a metal wiring constituting a gate electrode and a gate wiring, and a capacitor electrode and a capacitor wiring, for example. A specific mode is given below.

A mode of the invention disclosed is a method for manufacturing a light-emitting device having a thin film transistor in which a gate electrode layer is formed using side etching, and a source electrode and drain electrode layer is provided above the gate electrode layer with the use of a resist mask having a depressed portion.

In another mode of the invention disclosed, a method for manufacturing a light-emitting device, includes the steps of: forming a first conductive film over an insulating surface; forming a first insulating film over the first conductive film; forming a semiconductor film over the first insulating film; forming an impurity semiconductor film over the semiconductor film; forming a second conductive film over the impurity semiconductor film; forming a first resist mask over the second conductive film; performing first etching on the first conductive film, the first insulating film, the semiconductor film, the impurity semiconductor film, and the second conductive film using the first resist mask to expose the first conductive film; performing second etching on a part of the first conductive film to form a gate electrode layer so that a width of the gate electrode layer becomes smaller than a width of the first insulating film; removing the first resist mask after the second etching; forming a second resist mask after the removing the first resist mask; performing third etching on the second conductive film, the impurity semiconductor film, and a part of the semiconductor film using the second resist mask, to form a source electrode layer and a drain electrode layer, a source region layer and a drain region layer, and a semiconductor layer; removing the second resist mask; forming a second insulating film to cover the source electrode layer and the drain electrode layer, the source region layer and the drain region layer, and the semiconductor layer after removing the second resist mask; forming a first opening portion in the second insulating film; selectively forming a first pixel electrode layer electrically connected to one of the source electrode layer and the drain electrode layer through the first opening portion in the second insulating film; forming a third insulating film to cover the second insulating film and the first pixel electrode layer; forming a second opening portion by removing a part of the third insulating film which overlaps with the first pixel electrode layer; and selectively forming an EL layer over the first pixel electrode layer in the second opening portion, in which the third insulating film includes a portion that is closer to the insulating surface than the second conductive film and includes the second opening portion.

In another mode of the invention disclosed, a method for manufacturing a light-emitting device, includes the steps of: forming a first conductive film over an insulating surface; forming a first insulating film over the first conductive film; forming a semiconductor film over the first insulating film; forming an impurity semiconductor film over the semiconductor film; forming a second conductive film over the impurity semiconductor film; forming a first resist mask having a depressed portion, over the second conductive film; performing first etching on the first insulating film, the semiconductor film, the impurity semiconductor film, and the second conductive film using the first resist mask to expose the first conductive film; performing second etching on a part of the first conductive film to form a gate electrode layer so that a width of the gate electrode layer becomes smaller than a width of the first insulating film; forming a second resist mask by making the first resist mask recede to expose a region of the second conductive film which overlaps with the depressed portion of the first resist mask; performing third etching on the second conductive film, the impurity semiconductor film, and a part of the semiconductor film using the second resist mask to form a source electrode layer and a drain electrode layer, a source region layer and a drain region layer, and a semiconductor layer; removing the second resist mask; forming a second insulating film to cover the source electrode layer and the drain electrode layer, the source region layer and the drain region layer, and the semiconductor layer after removing the second resist mask; forming a first opening portion in the second insulating film; selectively forming a first pixel electrode layer electrically connected to one of the source electrode layer and the drain electrode layer through the first opening portion in the second insulating film; forming a third insulating film to cover the second insulating film and the first pixel electrode layer; forming a second opening portion by removing a part of the third insulating film which overlaps with the first pixel electrode layer; and selectively forming an EL layer over the first pixel electrode layer in the second opening portion; in which the third insulating film includes a portion that is closer to the insulating surface than the second conductive film and includes the second opening portion.

In the above, the resist mask having the depressed portion can be formed with the use of a multi-tone photomask.

Further, in the above, it is preferable to form the EL layer selectively by a printing method or an inkjet method.

The gate electrode layer having a side face which is present at an inner position by a given distance from a side face of a pattern which is formed from the first insulating film by the first etching can be formed by the side etching. It is preferable to perform dry etching for the first etching, and wet etching for the second etching because processing by the first etching is preferably performed with high accuracy and that by the second etching needs to involve side etching.

A light-emitting device can be manufactured by the above manufacturing method. Further, a variety of electronic appliances can be provided using the light-emitting device.

In this specification, "corrosion" means unintended etching. It is preferable to perform etching under a condition in which as little "corrosion" is caused as possible.

Further, in this specification, a "gate wiring" means a wiring connected to a gate electrode of a thin film transistor. A gate wiring is formed with a gate electrode layer. A gate wiring can also be called a "scanning line."

Furthermore, in this specification, a "source wiring" means a wiring connected to a source electrode and a drain electrode of a thin film transistor. A source wiring is formed with a source electrode and drain electrode layer. A source wiring can also be called a "signal line."

Still furthermore, in this specification, a "power supply line" means a wiring which is connected to a power supply and is kept at constant potential.

According to a mode of the invention disclosed, the number of steps involved in manufacturing a thin film transistor can be reduced significantly. That is, a process of manufacturing a light-emitting device can be simplified. In a conventional technique to reduce the number of photomasks, electric characteristics are sacrificed in many cases; however, according to a mode of the invention disclosed, electric characteristics can be maintained, and further, the number of steps involved in manufacturing a thin film transistor can be reduced. Thus, a light-emitting device with high performance can be provided at low cost.

Further, the number of steps for manufacturing a thin film transistor can be reduced significantly without complicated steps such as backside light exposure, resist reflow, lift-off, and the like. Therefore, a yield is improved compared with a process involving the above complicated step or the like.

A thin film transistor manufactured by a manufacturing method disclosed herein has less leakage current between a gate electrode and a drain electrode because it has a cavity in contact with an end portion of a gate electrode layer. Further, the cavity can make a portion adjacent to the end portion of the gate electrode have a low permittivity (low-k).

Further, according to a method for manufacturing a thin film transistor which is disclosed herein, a thin film transistor can be manufactured with the use of one photomask, whereby misalignment can be prevented in aligning a photomask.

Furthermore, by forming EL layers selectively by a printing method, an inkjet method, or the like, the EL layers can be formed separately with projections and depressions due to thin film transistors or the like (e.g. a projection and a depression due to a source wiring) utilized; thus, accuracy of forming the EL layers is improved. That is, the accuracy of forming the EL layers can be improved and the efficiency of manufacturing a light-emitting device can be improved without employing a special structure.

BRIEF DESCRIPTION OF THE DRAWINGS

In the accompanying drawings:

FIGS. 10A to 10C are drawings showing an example of a method for manufacturing thin film transistors and a display device;

FIGS. 16A-1, 16A-2, 16B-1, and 16B-2 are drawings showing multi-tone photomasks;

DETAILED DESCRIPTION OF THE INVENTION

Embodiment Modes

Figure 1:
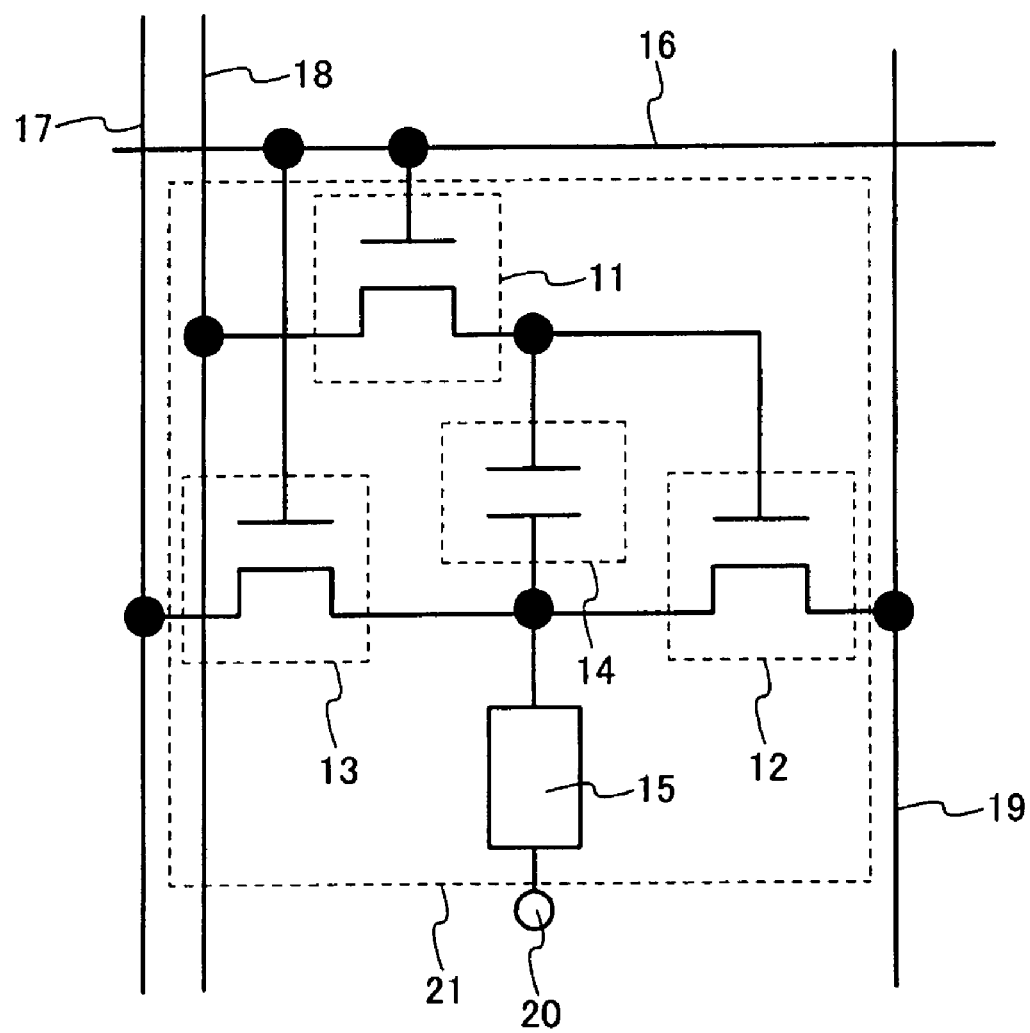
FIG. 1 is a drawing showing an example of a pixel circuit of a display device.

Hereinafter, embodiment modes are described with reference to the drawings. Note that the invention disclosed in this specification is not limited to the description of the embodiment modes given below, and it is apparent to those skilled in the art that the modes and details can be modified in many different ways without departing from the spirit of the invention. Further, structures according to different embodiment modes can be carried out with appropriate combination. In structures of the invention described below, the same reference numeral is given to the same parts or parts having similar functions, and repeated description thereof is omitted. Further, the same hatching pattern is given to similar parts, and the similar parts are not especially designated by reference numerals in some cases. Further, for the sake of simplicity, a part of a structure is not shown in a top view in some cases.

Embodiment Mode 1

This embodiment mode describes a method for manufacturing thin film transistors and a method for manufacturing an EL display device which is an example of a light-emitting device in which the thin film transistors are arranged in a matrix, with reference to FIGS. 1 to 19C.

As a pixel circuit in an EL display device in which thin film transistors are used as switching elements (an active matrix EL display device), a variety of types are being studied. In this embodiment mode, an example of a simple pixel structure is shown in FIG. 1, and a method for forming a pixel structure to which this pixel circuit is applied is described.

In the pixel structure of an EL display device shown in FIG. 1, a pixel 21 includes a first transistor 11, a second transistor 12, a third transistor 13, a capacitor element 14, and a light-emitting element 15. The first to third transistors are n-channel transistors. A gate electrode of the first transistor 11 is connected to a gate wiring 16; one of a source electrode and a drain electrode (a first electrode) of the first transistor 11 is connected to a source wiring 18; the other of the source electrode and the drain electrode (a second electrode) of the first transistor 11 is connected to a gate electrode of the second transistor 12 and to one electrode (a first electrode) of the capacitor element 14. The other electrode (a second electrode) of the capacitor element 14 is connected to one of a source electrode and a drain electrode (a first electrode) of the second transistor 12, one of a source electrode and a drain electrode (a first electrode) of the third transistor 13, and to one electrode (a first electrode) of the light-emitting element 15. The other of the source electrode and the drain electrode (a second electrode) of the second transistor 12 is connected to a second power supply line 19. The other of the source electrode and the drain electrode (a second electrode) of the third transistor 13 is connected to a first power supply line 17, and a gate electrode of the third transistor 13 is connected to the gate wiring 16. The other electrode (a second electrode) of the light-emitting element 15 is connected to a common electrode 20. Potential of the first power supply line 17 is different from that of the second power supply line 19.

An operation of the pixel 21 is described below. When the third transistor 13 is turned on by a signal from the gate wiring 16, potential of the first electrode of the second transistor 12, the first electrode of the light-emitting element 15, and the second electrode of the capacitor element 14 comes to be equal to potential ($V_{17}$) of the first power supply line 17. Since the first power supply line 17 has constant potential here, the first electrode of the second transistor 12 and the like also has constant potential ($V_{17}$).

When the first transistor 11 is selected to be turned on by a signal from the gate wiring 16, potential ($V_{18}$) of a signal from the source wiring 18 is input to the gate electrode of the second transistor 12 through the first transistor 11. At this time, higher potential ($V_{19}$) of the second power supply line 19 than that of the first power supply line 17 leads to $V_{gs}=V_{18}-V_{17}$. Further, if $V_{gs}$ is higher than the threshold voltage of the second transistor 12, the second transistor 12 is turned on.

In order to operate the second transistor 12 in a linear region, the on- and off-states of the second transistor 12 can be controlled by changing the potential ($V_{18}$) of the source wiring 18 (e.g. binary values). In order to operate the second transistor 12 in a saturation region, the amount of current fed into the light-emitting element 15 can be controlled by changing the potential ($V_{18}$) of the source wiring 18.

Needless to say, a structure of a mode of the invention disclosed is not limited to the above. The amount of current may be controlled in operating the second transistor 12 in a linear region, or the on- and off-states may be controlled in operating the second transistor 12 in a saturation region.

The light-emitting state and the non-light-emitting state of the light-emitting element 15 can be controlled by controlling the on- and off-states of the second transistor 12. Such a driving method can be applied to digital time gray scale driving, for example. In the digital time gray scale driving, one frame period is divided into a plurality of subframe periods, and the light-emitting state or the non-light-emitting state of the light-emitting element 15 is controlled in each subframe period.

When the amount of current fed into the light-emitting element 15 is controlled with the second transistor 12, the luminance of the light-emitting element can be controlled.

Next, a pixel structure to which the pixel circuit shown in FIG. 1 is applied and a manufacturing method thereof is described below.

Figure 6:
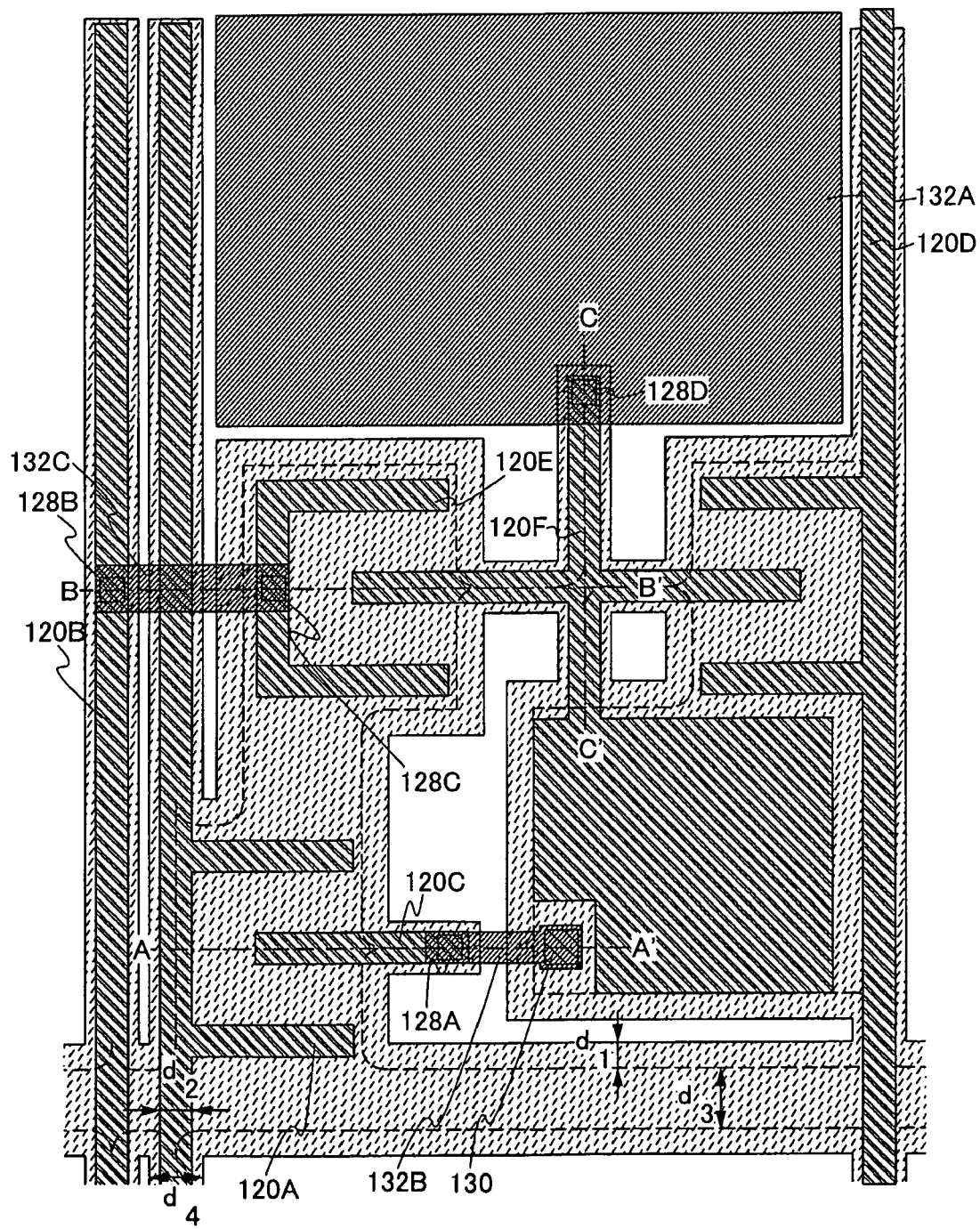
FIG. 6 is a drawing showing an example of a method for manufacturing thin film transistors and a display device.

FIGS. 2 to 6 are top views of a thin film transistor according to this embodiment mode. FIG. 6 is a completion drawing in which components up to a pixel electrode have been formed. FIGS. 7A to 7C, FIGS. 8A to 8C, and FIGS. 9A to 9C are cross-sectional views taken along lines A-A' in FIGS. 2 to 6. FIGS. 10A to 10C, FIGS. 11A to 11C, and FIGS. 12A to 12C are cross-sectional views taken along lines B-B' in FIGS. 2 to 6. FIGS. 13A to 13C, FIGS. 14A to 14C, and FIGS. 15A to 15C are cross-sectional views taken along lines C-C' in FIGS. 2 to 6.

First, a first conductive film 102, a first insulating film 104, a semiconductor film 106, an impurity semiconductor film 108, and a second conductive film 110 are formed over a substrate 100. Each of the films may be formed with a single layer or by stacking a plurality of films.

The substrate 100 has an insulating surface. When the invention disclosed is applied to a display device, it is preferable to use a substrate having a light-transmitting property, such as a glass substrate or a quartz substrate, as the substrate 100. In this embodiment mode, a glass substrate is used as the substrate 100.

The first conductive film 102 can be formed using a conductive material. For example, a conductive material such as a metal material (e.g. titanium, molybdenum, chromium, tantalum, tungsten, aluminum, copper, neodymium, niobium, or scandium) or an alloy material containing the above metal material as a main component may be used. Note that it is necessary that the first conductive film 102 have enough heat resistance to withstand the following steps (a step of forming the first insulating film 104 and the like) and be formed using a material which is resistant to corrosion in the following steps (a step of etching the second conductive film 110 and the like). As long as the first conductive film 102 satisfies the above conditions, a material of the first conductive film 102 is not limited to a particular one.

The first conductive film 102 can be formed, for example, by a sputtering method, a CVD method (including a thermal CVD method, a plasma CVD method, and the like), or the like. However, a method for forming the first conductive film 102 is not limited to a particular one.

The first insulating film 104 functions as a gate insulating film, and can be formed using an insulating material. For example, a silicon oxide film, a silicon nitride film, a silicon oxynitride film, a silicon nitride oxide film, or the like can be used. Note that it is necessary that the first insulating film 104 also have a certain degree of heat resistance as the first conductive film 102 has, and be formed using a material which is resistant to corrosion in the following steps. As long as the first insulating film 104 satisfies the above conditions, a material of the first insulating film 104 is not limited to a particular one.

The first insulating film 104 can be formed, for example, by a CVD method (including a thermal CVD method, a plasma CVD method, and the like), a sputtering method, or the like. However, a method for forming the first insulating film 104 is not limited to a particular one.

The semiconductor film 106 can be formed using a semiconductor material. For example, an amorphous silicon film formed using a silane gas is used. Note that it is necessary that the semiconductor film 106 also have a certain degree of heat resistance as the first conductive film 102 has, and be formed using a material which is resistant to corrosion in the following steps. As long as the semiconductor film 106 satisfies the above conditions, a material of the semiconductor film 106 is not limited to a particular one. Thus, germanium or the like may be used.

The semiconductor film 106 can be formed, for example, by a CVD method (including a thermal CVD method, a plasma CVD method, and the like), a sputtering method, or the like. However, a method for forming the semiconductor film 106 is not limited to a particular one.

As the semiconductor film 106, a crystalline semiconductor film and an amorphous semiconductor film may be stacked. As a crystalline semiconductor film, a polycrystalline semiconductor film, a microcrystal semiconductor film, or the like can be used.

A polycrystalline semiconductor contains crystal grains with diameters of more than 100 nm, and is formed by a thermal crystallization method or a laser crystallization method, for example. The thermal crystallization method here means a crystallization method in which an amorphous semiconductor film is formed over a substrate and the substrate is heated, thereby crystallizing the amorphous semiconductor. Further, the laser crystallization method means a crystallization method in which an amorphous semiconductor film is formed over a substrate and the amorphous semiconductor film is irradiated directly with laser light, thereby crystallizing the amorphous semiconductor. Alternatively, a crystallization method in which crystallization proceeds by adding a crystallization promotion element such as nickel may be employed. In a case where crystallization is performed by adding a crystallization promotion element, it is preferable that the semiconductor film undergo laser light irradiation.

A microcrystal semiconductor contains crystal grains with diameters of 2 nm to 100 nm, approximately. As a method for forming a microcrystal semiconductor, the following methods can be employed, for example: a method in which crystal nuclei are formed and are made to grow; or a method in which an amorphous semiconductor film is formed, and an insulating film and a metal film are formed to be in contact with the amorphous semiconductor film, and the metal film is irradiated with laser, thereby crystallizing the amorphous semiconductor with heat generated in the metal film.

By using stacked films that are formed by stacking an amorphous semiconductor film over a crystalline semiconductor film as the semiconductor film 106, characteristics necessary for operation of the transistors included in the pixel circuit of the EL display device can be obtained easily. As the crystalline semiconductor film here, a polycrystalline semiconductor film, a microcrystal semiconductor film, or the like can be used.

An amorphous semiconductor film over a crystalline semiconductor film can prevent a surface of the crystalline semiconductor film from being oxidized. Further, resistance to voltage is improved and off current can be reduced.

The impurity semiconductor film 108 contains an impurity element imparting one conductivity type, and is formed using a semiconductor source gas or the like to which the impurity element imparting one conductivity type is added. In this embodiment mode, n-channel thin film transistors are formed; thus, for example, a silicon film containing phosphorus is formed using a silane gas containing phosphine (chemical formula: $PH_3$). If p-channel thin film transistors are formed, for example, a silicon film containing boron can be formed using a silane gas containing diborane (chemical formula: $B_2H_6$). Note that it is necessary that the impurity semiconductor film 108 also have a certain degree of heat resistance as the first conductive film 102 and the like have, and be formed using a material which is resistant to corrosion in the following steps. As long as the impurity semiconductor film 108 satisfies the above conditions, a material of the impurity semiconductor film 108 is not limited to a particular one. Further, there is no particular limitation on the crystallinity of the impurity semiconductor film 108.

As the impurity element which imparts one conductivity type and is added in order to manufacture the n-channel thin film transistors, arsenic or the like may be used. For example, with arsine (chemical formula: $AsH_3$) added to a silane gas at a desired concentration, a silicon film containing arsenic can be formed.

The impurity semiconductor film 108 can be formed, for example, by a CVD method (including a thermal CVD method, a plasma CVD method, and the like) or the like. However, a method for forming the impurity semiconductor film 108 is not limited to a particular one.

The second conductive film 110 is formed using a different conductive material from that of the first conductive film 102 (from materials described as examples of those for forming the first conductive film 102). "Different materials" here mean materials containing different main components. Specifically, a material which is resistant to following second etching is used. Note that it is necessary that the second conductive film 110 also have a certain degree of heat resistance as the first conductive film 102 and the like have, and be formed using a material which is resistant to corrosion in the following steps. As long as the second conductive film 110 satisfies the above conditions, a material of the second conductive film 110 is not limited to a particular one.

The second conductive film 110 can be formed, for example, by a sputtering method, a CVD method (including a thermal CVD method, a plasma CVD method, and the like), or the like. However, a method for forming the second conductive film 110 is not limited to a particular one.

Figure 7A:
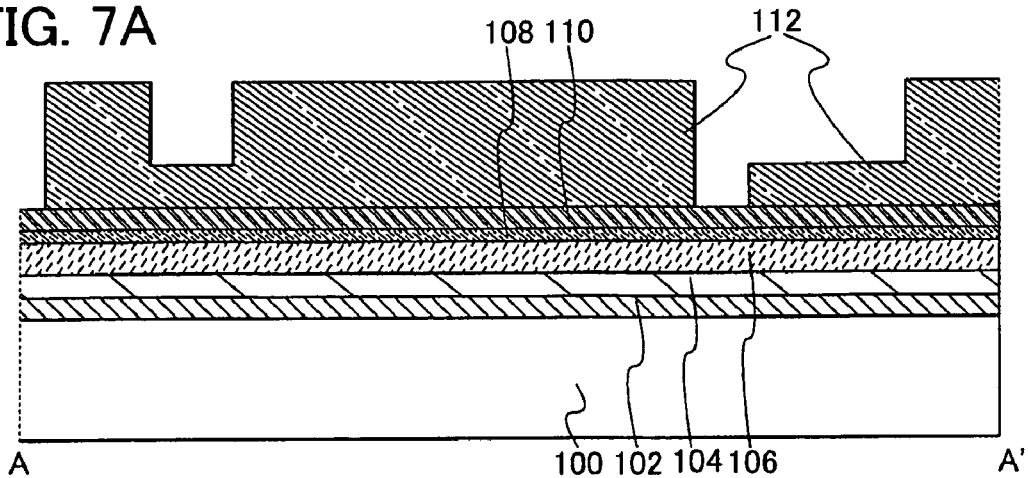
FIGS. 7A to 7C are drawings showing an example of a method for manufacturing thin film transistors and a display device.
Figure 7B:
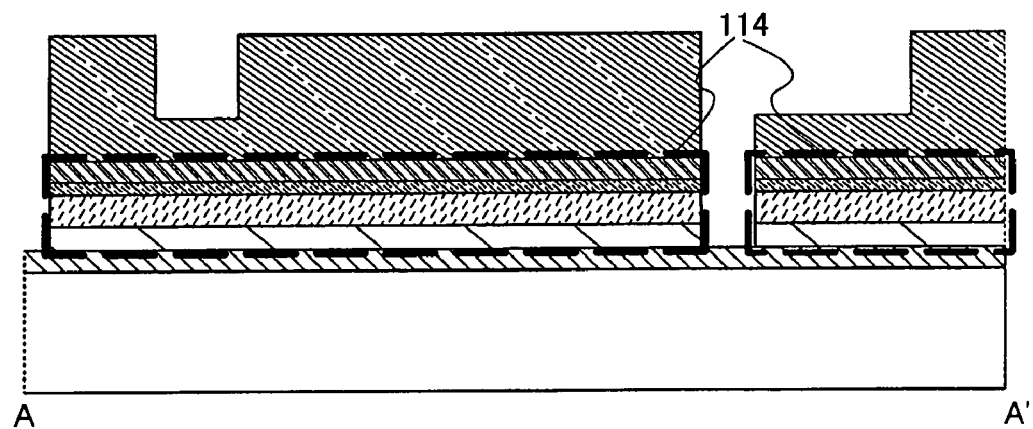
Figure 7C:
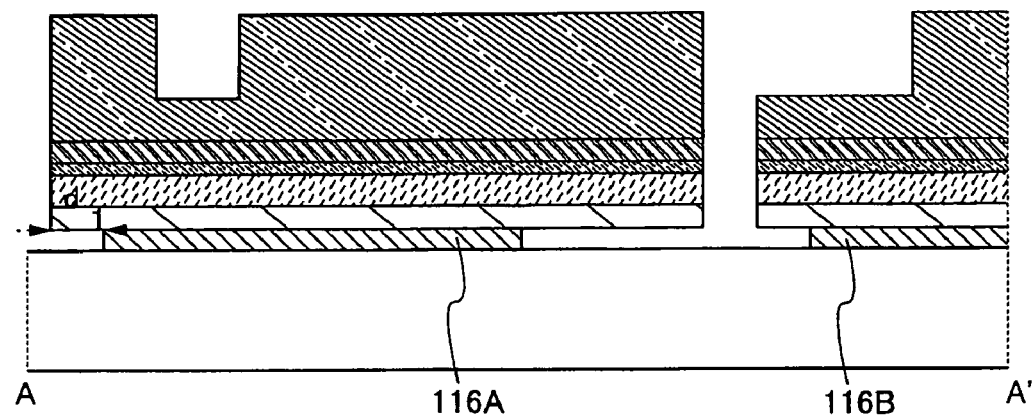
Figure 13A:
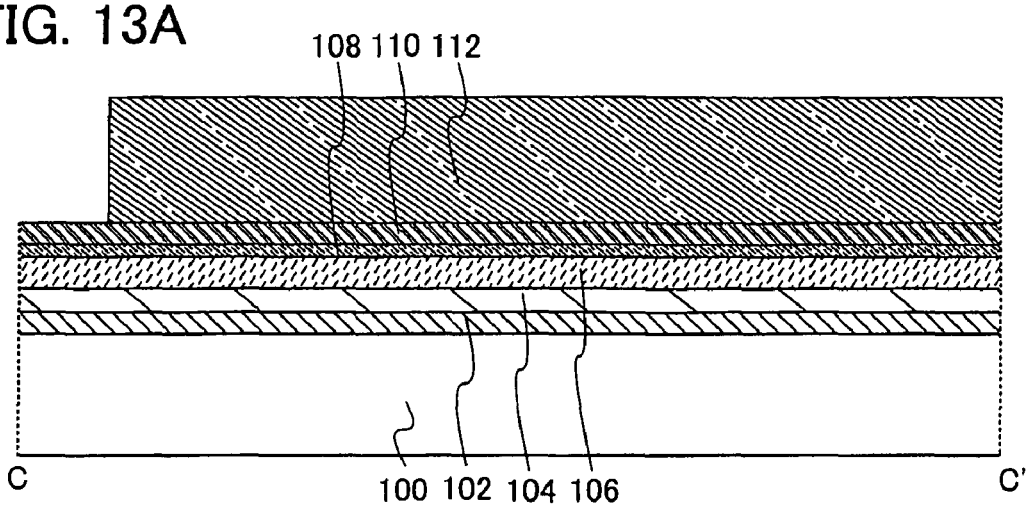
FIGS. 13A to 13C are drawings showing an example of a method for manufacturing thin film transistors and a display device.
Figure 13B:
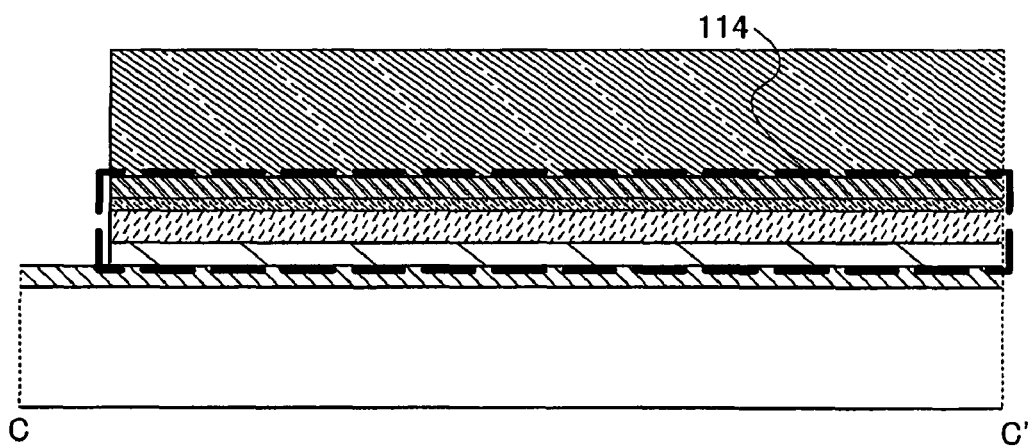
Figure 13C:
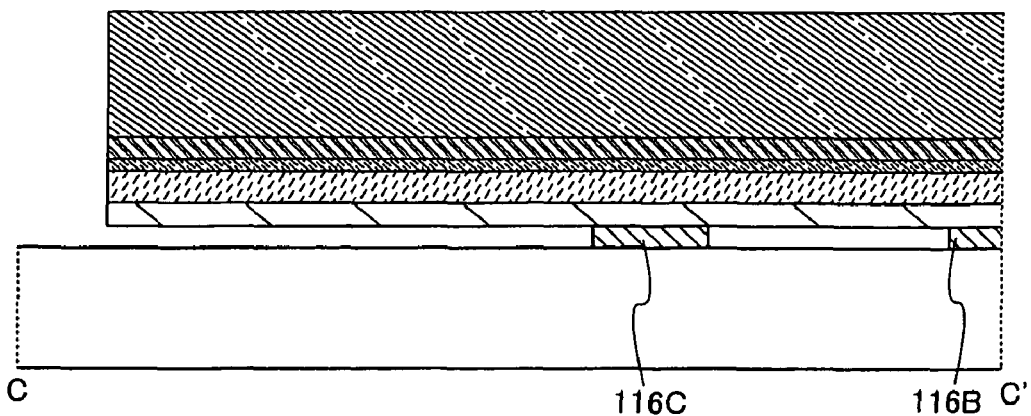
Figure 14A:
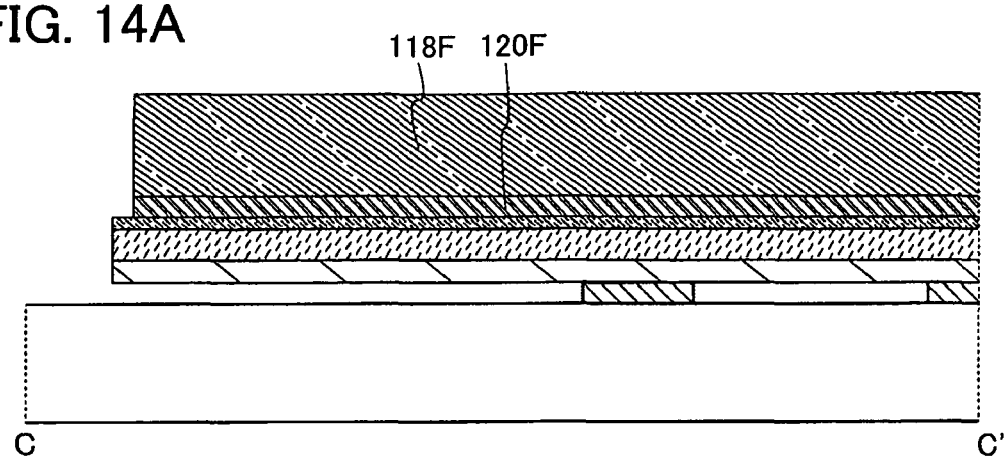
FIGS. 14A to 14C are drawings showing an example of a method for manufacturing thin film transistors and a display device.
Figure 14B:
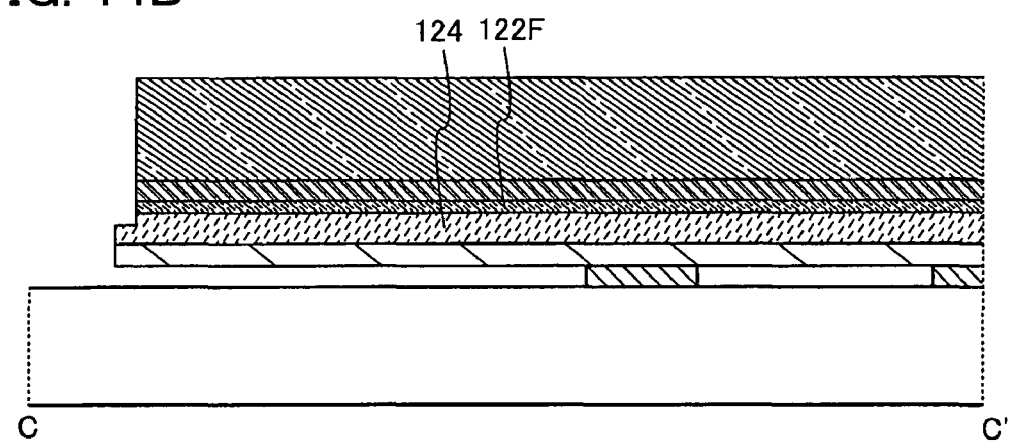
Figure 14C:
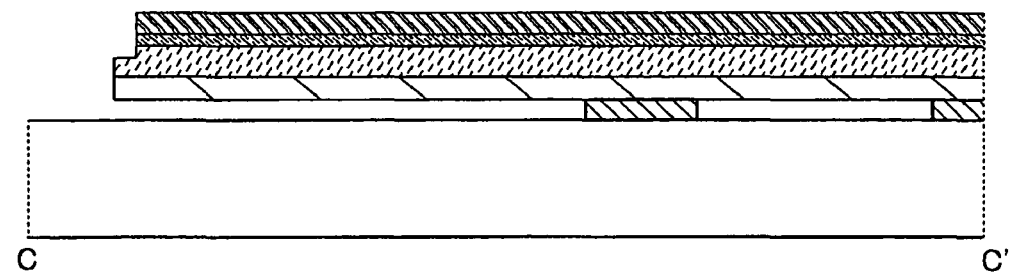
Figure 15A:
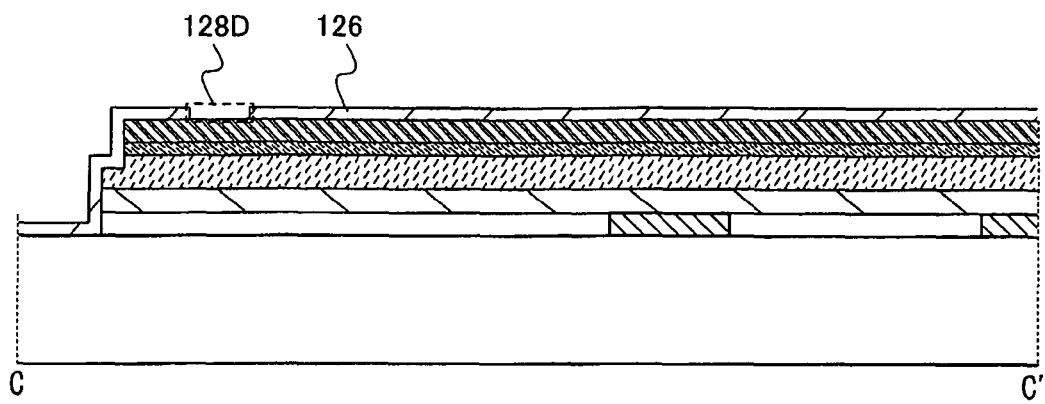
FIGS. 15A to 15C are drawings showing an example of a method for manufacturing thin film transistors and a display device.
Figure 15B:
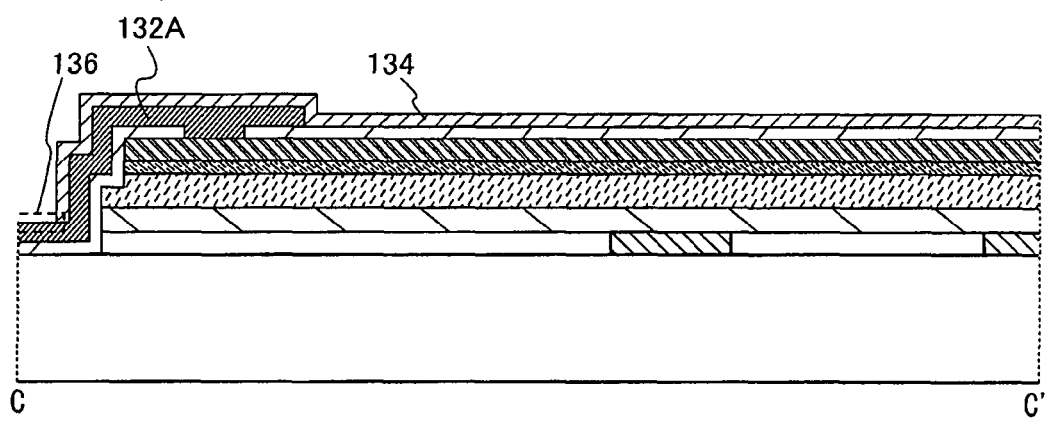
Figure 15C:
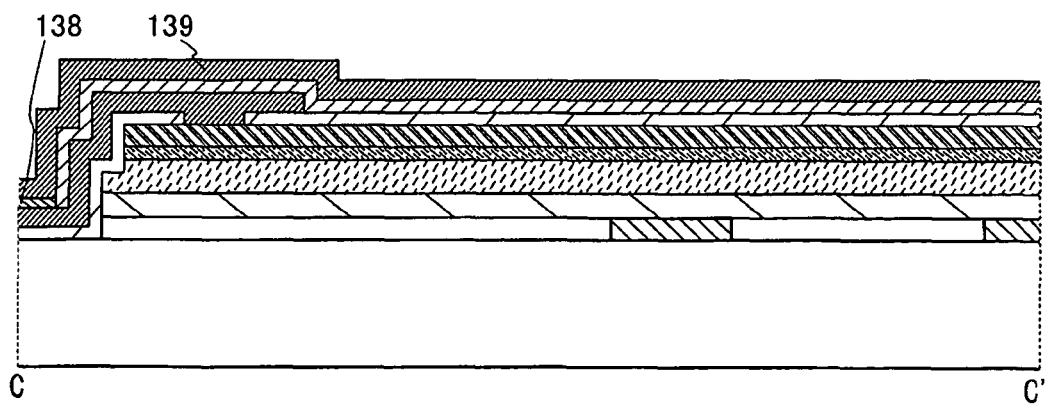

Next, a first resist mask 112 is formed over the second conductive film 110 (see FIGS. 7A, 10A, and 13A). The first resist mask 112 has a depressed portion or a projected portion. In other words, the first resist mask 112 includes a plurality of regions (in this embodiment mode, two regions) with different thicknesses. In the first resist mask 112, a region with a larger thickness is referred to as a "projected portion of the first resist mask 112," and a region with a smaller thickness is referred to as a "depressed portion of the first resist mask 112."

In the first resist mask 112, the projected portion is formed in a region under which the source electrode and drain electrode layer is formed, and the depressed portion is formed in a region under which the semiconductor layer is exposed instead of providing the source electrode and drain electrode layer.

The first resist mask 112 can be formed with the use of a multi-tone photomask. Hereinafter, description is made on multi-tone photomasks with reference to FIGS. 16A-1, 16A-2, 16B-1, and 16B-2.

With a multi-tone photomask, light exposure can be performed with light having plural degrees of intensity, typically, with light having three degrees of intensity, i.e. an exposed region, a semi-exposed region, and an unexposed region. A multi-tone photomask makes it possible to form a resist mask with plural thicknesses (typically, two levels of thicknesses) by one-time exposure and development process. Thus, a multi-tone photomask can reduce the number of photomasks.

Figures 1, 16A:
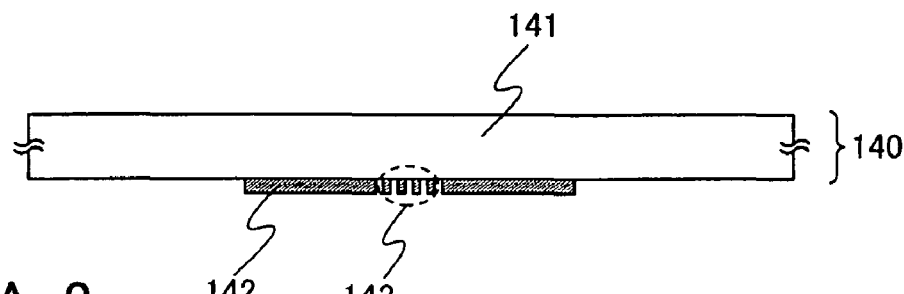
Figures 2, 16A:
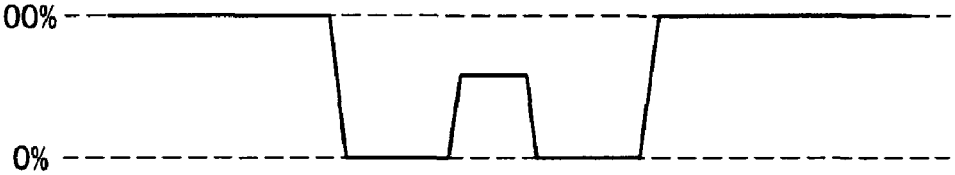
Figures 1, 16B:
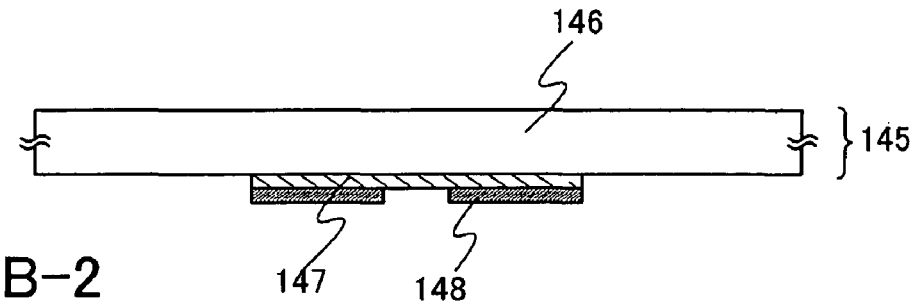
Figures 2, 16B:
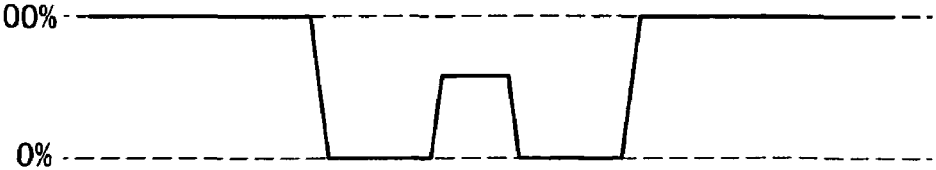

FIGS. 16A-1 and 16B-1 are cross-sectional views of typical multi-tone photomasks. The former shows a gray-tone mask 140 and the latter shows a half-tone mask 145.

The gray-tone mask 140 shown in FIG. 16A-1 includes a light-blocking portion 142 formed using a light-blocking film and a slit portion 143 formed by a pattern of the light-blocking film, which are formed on a substrate 141 having a light-transmitting property.

The slit portion 143 has slits (including dots, meshes, and the like) that are provided at intervals which are less than or equal to the resolution limit of light used for the exposure, whereby the light transmittance is controlled. The slit portion 143 can have slits with either regular or irregular intervals.

The substrate 141 having a light-transmitting property can be formed using quartz or the like. The light-blocking film constituting the light-blocking portion 142 and the slit portion 143 may be formed using a metal material; preferably, chromium, chromium oxide, or the like is used.

Figure 2:
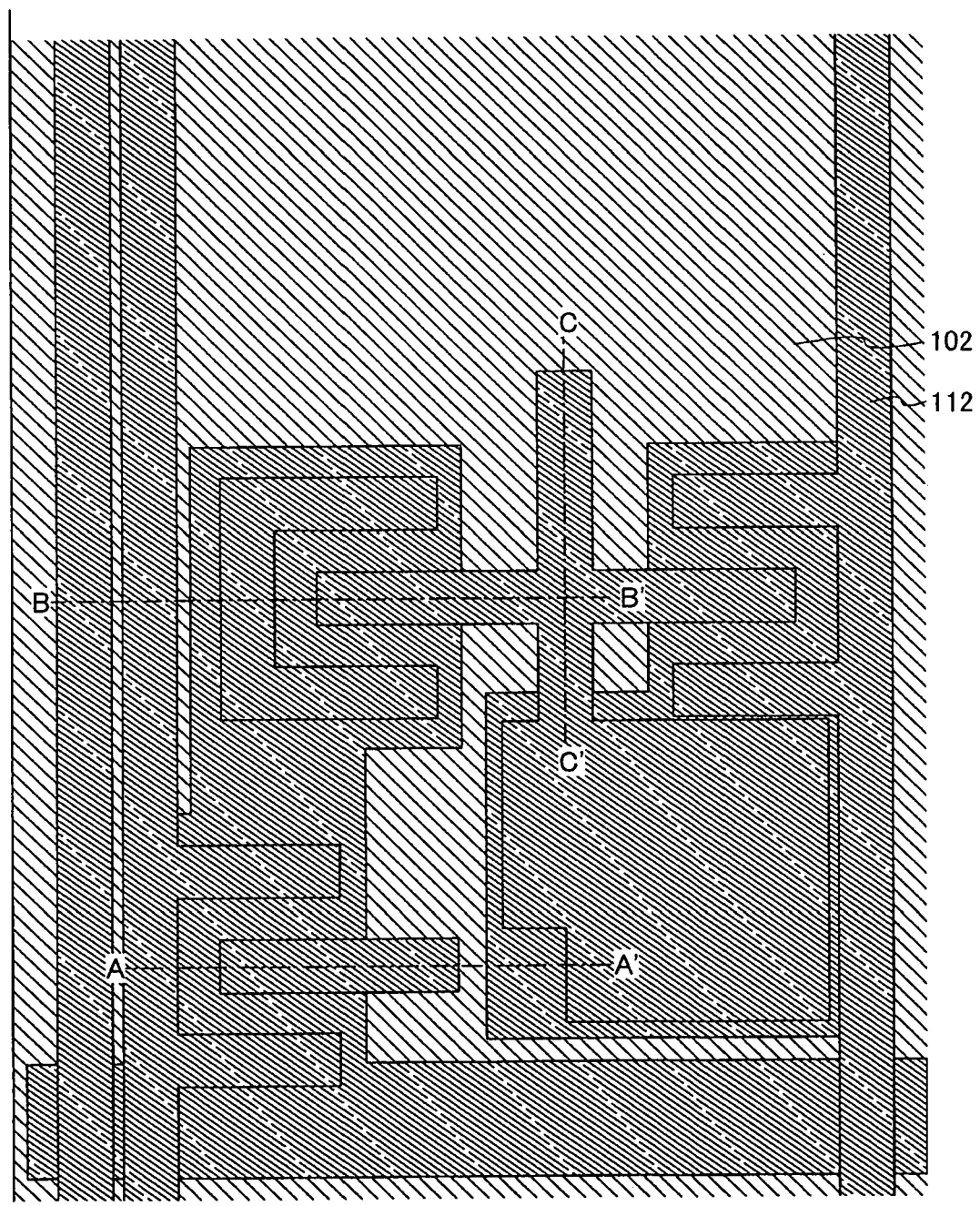
FIG. 2 is a drawing showing an example of a method for manufacturing thin film transistors and a display device.

When the gray-tone mask 140 is irradiated with light for exposure, a light transmittance of a region overlapping with the light-blocking portion 142 is 0% and that of a region where neither the light-blocking portion 142 nor the slit portion 143 is provided is 100%, as shown in FIG. 16A-2. The light transmittance of the slit portion 143 can be controlled with intervals of slits or the like, in a range of approximately 10% to 70%.

The half-tone mask 145 shown in FIG. 16B-1 includes a semi-light-transmitting portion 147 formed using a semi-light-transmitting film on a substrate 146 having a light-transmitting property, and a light-blocking portion 148 formed using a light-blocking film.

The semi-light-transmitting portion 147 can be formed using MoSiN, MoSi, MoSiO, MoSiON, CrSi, or the like. The light-blocking portion 148 may be formed using a similar metal material to the light-blocking film of the gray-tone mask; preferably, chromium, chromium oxide, or the like is used.

When the half-tone mask 145 is irradiated with light for exposure, a light transmittance of a region overlapping with the light-blocking portion 148 is 0% and that of a region where neither the light-blocking portion 148 nor the semi-light-transmitting portion 147 is provided is 100%, as shown in FIG. 16B-2. The light transmittance of the semi-light-transmitting portion 147 can be controlled with a material, a thickness, or the like of the semi-light-transmitting portion 147, in a range of approximately 10% to 70%.

By light exposure using a multi-tone photomask and development, the first resist mask 112 having regions with different thicknesses can be formed.

However, in a mode of the invention disclosed, a multi-tone photomask is not necessarily used.

Next, first etching is performed using the first resist mask 112. That is, the first insulating film 104, the semiconductor film 106, the impurity semiconductor film 108, and the second conductive film 110 are patterned by etching, so that a thin-film stacked body 114 is formed (see FIGS. 2, 7B, 10B, and 13B). At this time, it is preferable to expose at least a part of the first conductive film 102. In this specification, this etching step is called "first etching." For the first etching, either dry etching or wet etching may be performed; it is preferable to employ an etching method with high anisotropy (physical etching). By employing an etching method with high anisotropy for the first etching, the patterning accuracy can be improved. If the first etching is performed by dry etching, it involves one step, whereas if the first etching is performed by wet etching, it involves a plurality of steps. Therefore, it is preferable to employ dry etching for the first etching.

Subsequently, second etching is performed using the first resist mask 112. That is, the first conductive film 102 is patterned by etching, so that a gate electrode layer 116 is formed (see FIGS. 3, 7C, 10C, and 13C). In this specification, this etching step is called "second etching."

The gate electrode layer 116 constitutes the gate wiring, the gate electrodes of the transistors, and the one electrode of the capacitor element. A gate electrode layer 116A refers to a gate electrode layer which constitutes the gate wiring, the gate electrode of the first transistor 11, and the gate electrode of the third transistor 13; a gate electrode layer 116B refers to a gate electrode layer which constitutes the gate electrode of the second transistor 12 and the one electrode of the capacitor element 14; a gate electrode layer 116C refers to a gate electrode layer which constitutes a supporting portion. The gate electrode layers 116A, 116B, and 116C are collectively called the "gate electrode layer 116."

The second etching is performed under a condition in which a side face of the gate electrode layer 116, which is formed with the first conductive film 102, comes to be present at an inner position with respect to a side face of the thin-film stacked body 114. That is, this etching is performed so that the side face of the gate electrode layer 116 can be in contact with a bottom face of the thin-film stacked body 114 (in other words, this etching is performed so that the width of the gate electrode layer 116 can be smaller than that of the thin-film stacked body 114 in the cross-sectional view taken along the line A-A'). Further in other words, the side face of the gate electrode layer 116 comes to be present at an inner position with respect to that of the patterned first insulating film 104 (i.e. the gate insulating layer). The second etching is performed at a low etching rate with respect to the second conductive film 110 and a high etching rate with respect to the first conductive film 102. In other words, the etching selection ratio of the first conductive film 102 to the second conductive film 110 is high. By performing the second etching under such a condition, the gate electrode layer 116 can be formed.

For the second etching, either dry etching or wet etching may be performed; it is preferable to employ an etching method with predominant isotropy (chemical etching). By employing an etching method with predominant isotropy (chemical etching) for the second etching, the first conductive film can be side-etched. Therefore, it is preferable to employ wet etching for the second etching.

There is no particular limitation on the form of the side face of the gate electrode layer 116. For example, the side face of the gate electrode layer 116 may have a tapered form. The form of the side face of the gate electrode layer 116 is determined by conditions such as a chemical solution used in the second etching.

The condition of "a low etching rate with respect to the second conductive film 110 and a high etching rate with respect to the first conductive film 102" or "a high etching selection ratio of the first conductive film 102 to the second conductive film 110" satisfies the following first requirement and second requirement.

The first requirement is that the gate electrode layer 116 remains at a necessary portion. The necessary portion of the gate electrode layer 116 is a region designated by dotted lines in FIGS. 3 to 6. That is, it is necessary that the gate electrode layer 116 remain after the second etching so that it can constitute the gate wiring, the gate electrode, the one electrode of the capacitor element, the supporting portion, and the like. In order that the gate electrode layer can constitute the gate wiring and a capacitor wiring, it is necessary to perform the second etching so that these wirings cannot be disconnected. As shown in FIG. 3, FIG. 4, FIG. 5, FIG. 6, and FIGS. 7A to 7C, it is preferable that the side face of the gate electrode layer 116 be present at an inner position by a distance $d_1$ from the side face of the thin-film stacked body 114. A practitioner can determine the distance $d_1$ as appropriate.

The second requirement is that a width $d_3$ of the gate wiring and the capacitor wiring that are constituted of the gate electrode layer 116 and a smallest width $d_2$ of the source wiring and the power supply line that are constituted of a source electrode and drain electrode layer 120 have appropriate values (see FIG. 6). The second requirement is necessary because by etching the source electrode and drain electrode layer 120 by the second etching, the smallest width $d_2$ of the source wiring and the power supply line becomes smaller, and the source wiring and the power supply line come to have an excessive current density, so that electric characteristics deteriorate. Therefore, the second etching is performed under a condition in which the etching rate of the first conductive film 102 is not excessive and the etching rate of the second conductive film 110 is as low as possible.

It is difficult to make the smallest width $d_2$ of the source wiring and the power supply line larger because the smallest width $d_2$ of the source wiring and the power supply line is determined by a smallest width $d_4$ of the semiconductor layer overlapping with the source wiring and the power supply line, and in order to make the smallest width $d_2$ of the source wiring and the power supply line larger, the smallest width $d_4$ of the semiconductor layer has to be larger, which makes it difficult to insulate the adjacent gate wiring and capacitor wiring from each other. In a mode of the invention disclosed, the smallest width $d_4$ of the semiconductor layer is smaller than approximately two times the distance $d_1$. In other words, the distance $d_1$ is larger than approximately half the smallest distance $d_4$ of the semiconductor layer.

A portion with the smallest width $d_4$ of the semiconductor layer overlapping with the source wiring and the power supply line can be provided as appropriate at a necessary portion for insulating the gate electrode layer. The second etching can form a pattern in which the gate electrode layer 116 does not remain at a portion overlapping with the portion with the smallest width $d_4$ of the semiconductor layer.

It is preferable that a portion of the electrode which is constituted of the source electrode and drain electrode layer and is connected to a pixel electrode layer have the smallest width $d_2$ of the source wiring and the power supply line.

In a mode of the invention disclosed, it is highly important to perform the second etching under a condition involving side etching as described above. The reason is that when the second etching involves side etching of the first conductive film 102, a pattern can be formed in which a desired connection is obtained not only between the adjacent gate wirings, which are constituted of the gate electrode layer 116, but also between elements in a pixel circuit.

The side etching here means that a film to etch is etched not only in a thickness direction of the film to etch (a direction perpendicular to a substrate face or a direction perpendicular to a face of a base film for the film to etch) but also in a direction perpendicular to the thickness direction (a direction parallel to the substrate face or a direction parallel to the face of the base film for the film to etch). A shape of an end portion of the film to etch which has been side-etched varies depending on an etching rate of an etching gas or a chemical solution used in the etching with respect to the film to etch; in many cases, the end portion comes to have a curved face.

Figure 3:
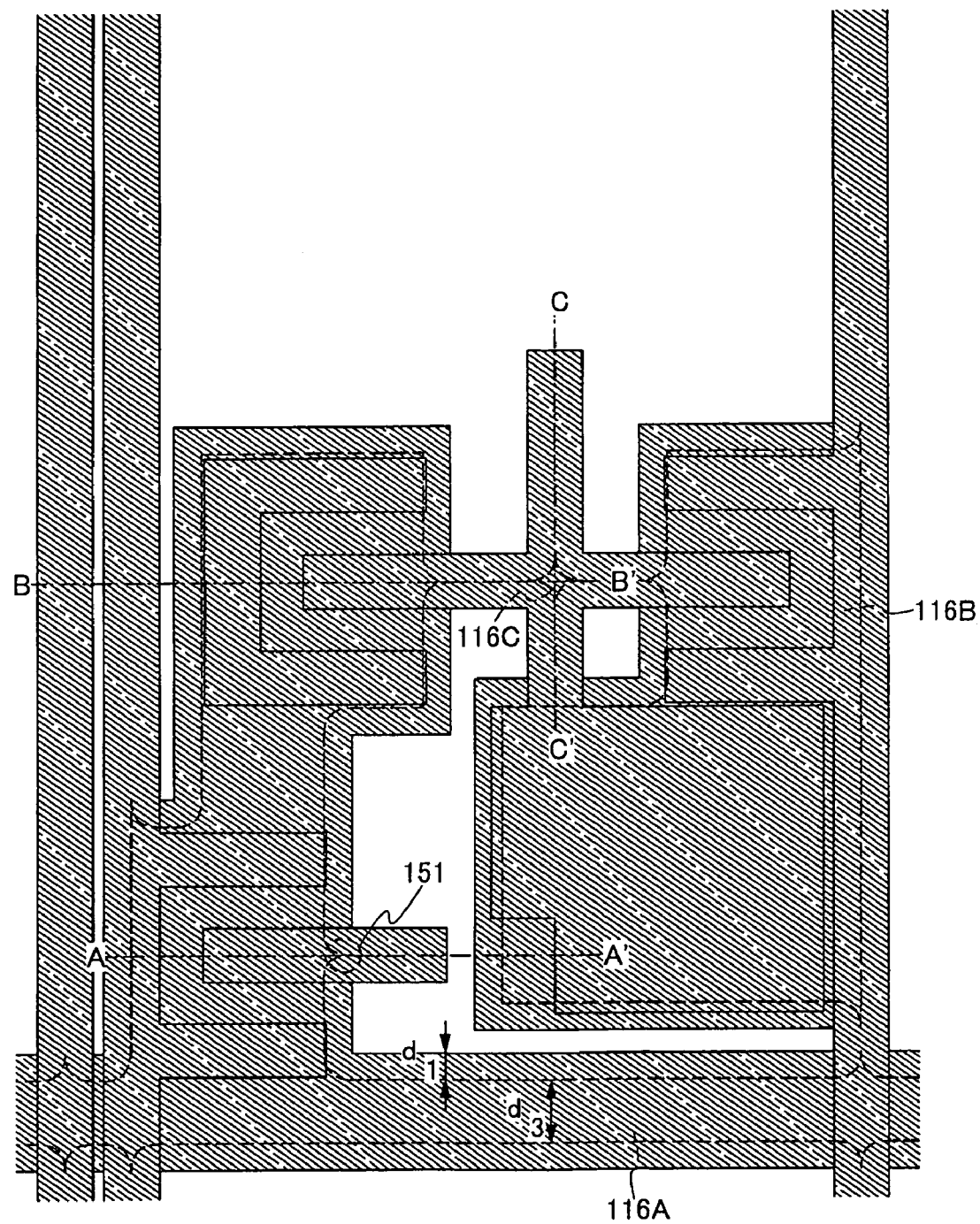
FIG. 3 is a drawing showing an example of a method for manufacturing thin film transistors and a display device.
Figure 4:
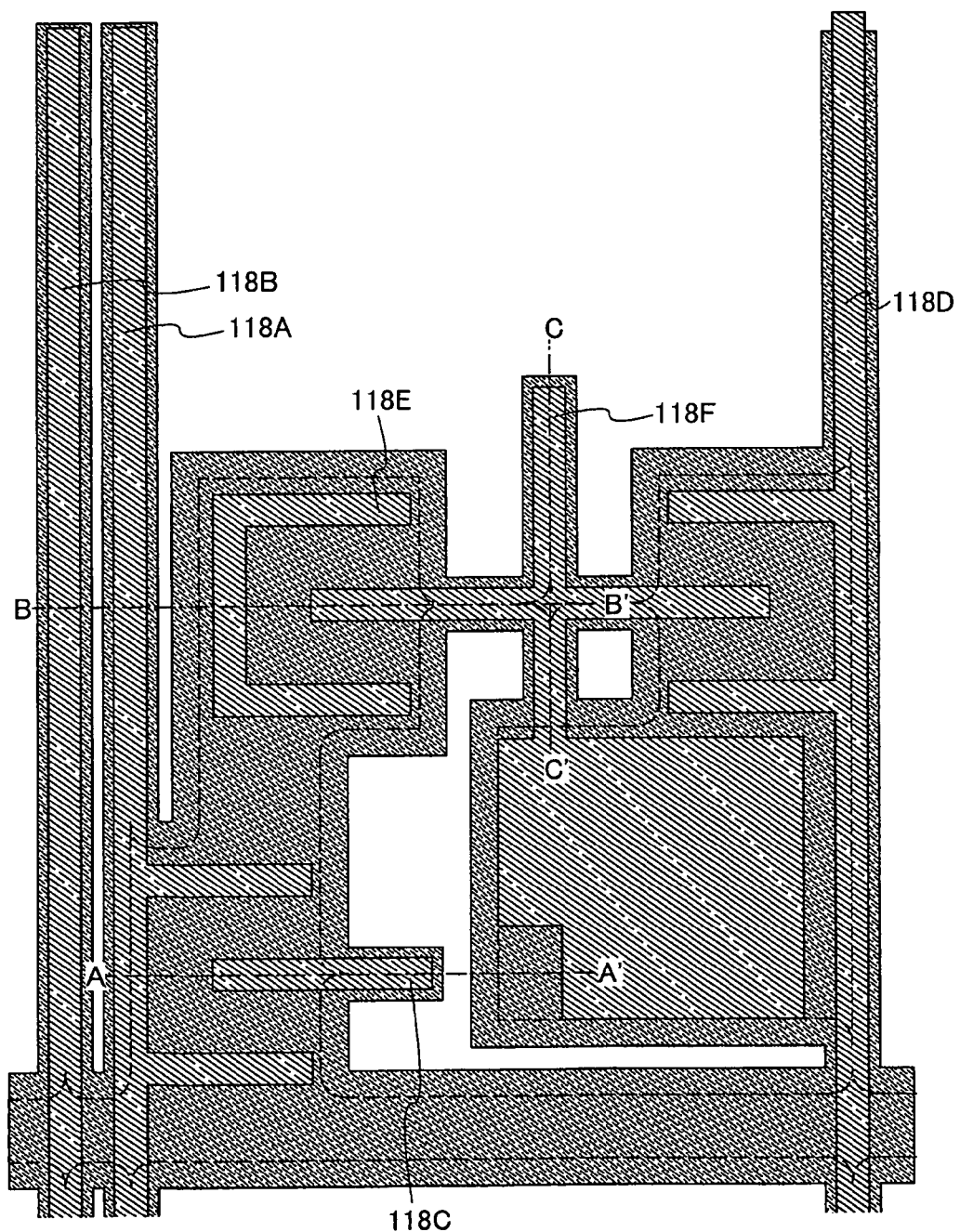
FIG. 4 is a drawing showing an example of a method for manufacturing thin film transistors and a display device.
Figure 5:
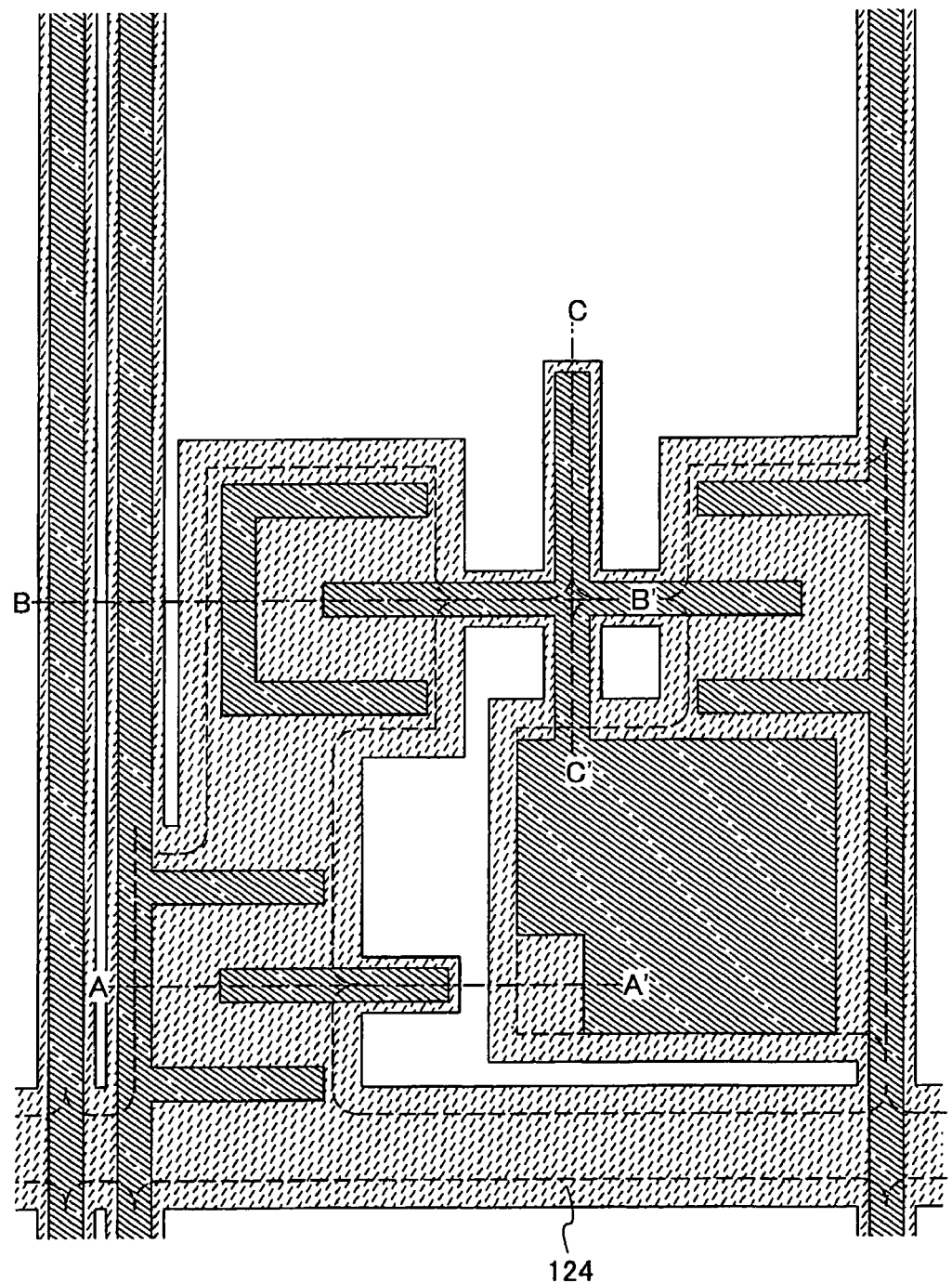
FIG. 5 is a drawing showing an example of a method for manufacturing thin film transistors and a display device.

The gate electrode layer 116C shown in FIG. 3 functions as the supporting portion for supporting the thin-film stacked body 114. The supporting portion can prevent the gate insulating film and the like that are formed above the gate electrode layer from being peeled. Further, the supporting portion can prevent the cavity region in contact with the gate electrode layer 116 that is formed by the second etching from becoming larger than is necessary. The supporting portion is desirable because it can prevent the thin-film stacked body 114 from being broken or damaged by a self weight. However, a mode of the invention disclosed is not limited to that of having the supporting portion, and the supporting portion is not necessarily provided.

As described above, it is preferable to perform the second etching by wet etching.

In the case where the second etching is performed by wet etching, the first conductive film 102 may be formed using aluminum or molybdenum, and the second conductive film 110 may be formed using titanium or tungsten, and a chemical solution containing nitric acid, acetic acid, and phosphoric acid may be used for the etching. Alternatively, the first conductive film 102 may be formed using molybdenum, and the second conductive film 110 may be formed using titanium, aluminum, or tungsten, and a chemical solution containing hydrogen peroxide water may be used for the etching.

In the case where the second etching is performed by wet etching, the most preferably, stacked films of a molybdenum film over an aluminum film to which neodymium is added are formed as the first conductive film 102, and the second conductive film 110 is formed using tungsten, and a chemical solution containing 2% nitric acid, 10% acetic acid, and 72% phosphoric acid is used for the etching. The chemical solution with such a composition ratio makes it possible to etch the first conductive film 102 without etching the second conductive film 110. The neodymium added to the first conductive film 102 lowers the resistance of the aluminum and generation of hillocks in the aluminum.

The gate electrode layer 116 has a corner portion (e.g. a corner portion 151) when seen from above (see FIG. 3). The reason is that since the second etching for forming the gate electrode layer 116 proceeds isotropically or almost isotropically, the distance $d_1$ between the side face of the gate electrode layer 116 and that of the thin-film stacked body 114 is uniform or almost uniform.

Next, the first resist mask 112 recedes to expose the second conductive film 110 and form a second resist mask 118. In order that the first resist mask 112 can recede to form the second resist mask 118, oxygen plasma ashing can be performed, for example. However, a method for making the first resist mask 112 recede to form the second resist mask 118 is not limited to the above. A region in which the second resist mask 118 is formed substantially corresponds to that of the projected portion of the first resist mask 112. An example is given here in which the second resist mask 118 is formed after the second etching; however, a mode of the invention disclosed is not limited to this, and the second etching may be performed after forming the second resist mask 118.

If a multi-tone photomask is not used in forming the first resist mask 112, a different photomask can be used to form the second resist mask 118 separately.

Subsequently, the second conductive film 110 in the thin-film stacked body 114 is etched using the second resist mask 118, so that the source electrode and drain electrode layer 120 is formed (see FIGS. 4, 8A, 11A, and 14A). An etching condition here is that films except the second conductive film 110 are not subject to corrosion or are resistant to corrosion. In particular, it is important to perform the etching under a condition in which the gate electrode layer 116 is not subject to corrosion or is resistant to corrosion.

The source electrode and drain electrode layer 120 constitutes the source wiring, the power supply line, the electrode which connects the thin film transistor and the pixel electrode, and the one electrode of the capacitor element, which functions as a holding capacitor. A source electrode and drain electrode layer 120A refers to an electrode layer which constitutes the source wiring and the one of the source electrode and the drain electrode of the first transistor 11; a source electrode and drain electrode layer 120B refers to an electrode layer which constitutes the first power supply line; a source electrode and drain electrode layer 120C refers to an electrode layer which constitutes the other of the source electrode and the drain electrode of the first transistor 11; a source electrode and drain electrode layer 120D refers to an electrode layer which constitutes the second power supply line and the one of the source electrode and the drain electrode of the second transistor 12; a source electrode and drain electrode layer 120E refers to an electrode layer which constitutes the one of the source electrode and the drain electrode of the third transistor 13; a source electrode and drain electrode layer 120F refers to an electrode layer which constitutes the one electrode of the capacitor element 14, the other of the source electrode and the drain electrode of the second transistor 12, the other of the source electrode and the drain electrode of the third transistor 13, and an electrode which connects these electrodes to the one electrode of the light-emitting element.

A second resist mask 118A overlaps with the source electrode and drain electrode layer 120A; a second resist mask 118B overlaps with the source electrode and drain electrode layer 120B; a second resist mask 118C overlaps with the source electrode and drain electrode layer 120C; a second resist mask 118D overlaps with the source electrode and drain electrode layer 120D; a second resist mask 118E overlaps with the source electrode and drain electrode layer 120E; the second resist mask 118F overlaps with the source electrode and drain electrode layer 120F.

For the etching of the second conductive film 110 in the thin-film stacked body 114, either wet etching or dry etching may be used.

Next, the impurity semiconductor film 108 and an upper portion of the semiconductor film 106 (a back channel portion) in the thin-film stacked body 114 is etched to form source region and drain region 122 (including 122A to 122F) and a semiconductor layer 124 (see FIGS. 5, 8B, 11B, and 14B). An etching condition here is that films except the impurity semiconductor film 108 and the semiconductor film 106 are not subject to corrosion or are resistant to corrosion. In particular, it is important to perform the etching under a condition in which the gate electrode layer 116 is not subject to corrosion or is resistant to corrosion.

The impurity semiconductor film 108 and the upper portion of the semiconductor film 106 (the back channel portion) in the thin-film stacked layer 114 can be etched by dry etching or wet etching.

After that, the second resist mask 118 is removed, and thin film transistors are completed (see FIGS. 6, 8C, 11C, and 14C).

Figure 8A:
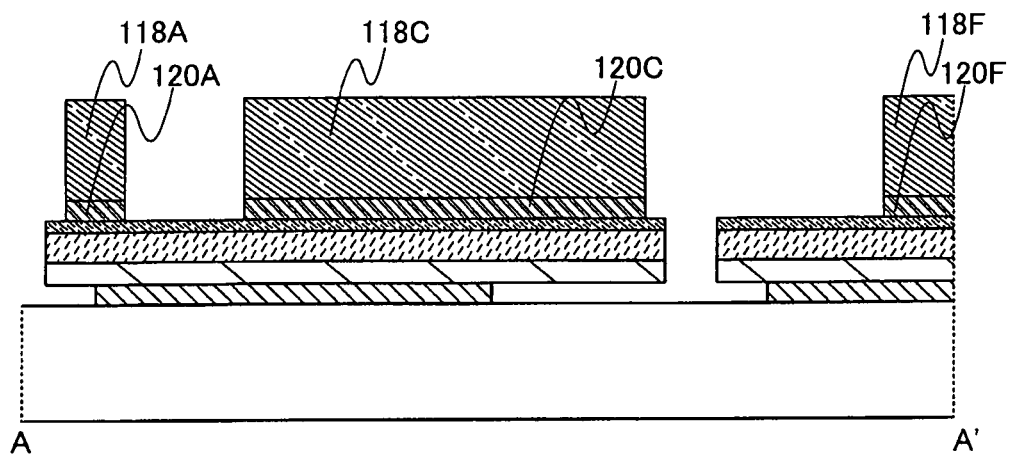
FIGS. 8A to 8C are drawings showing an example of a method for manufacturing thin film transistors and a display device.
Figure 8B:
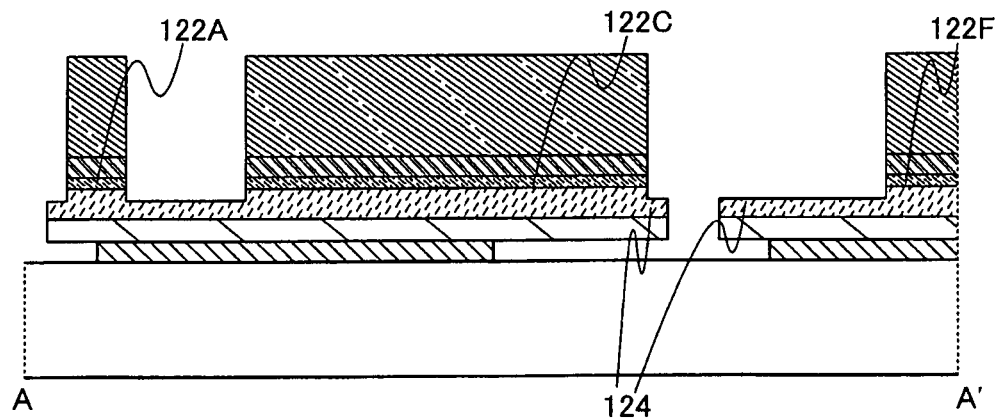
Figure 8C:
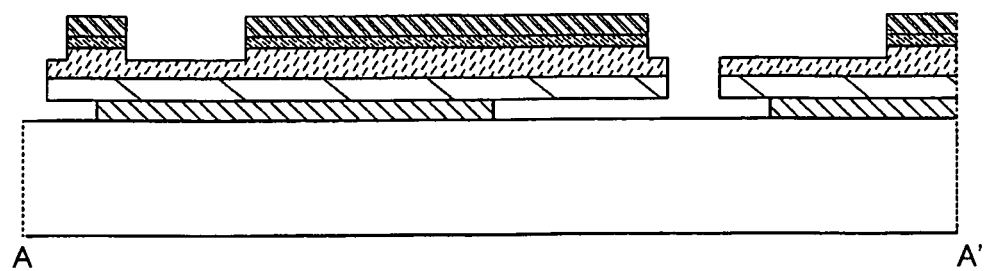
Figure 9A:
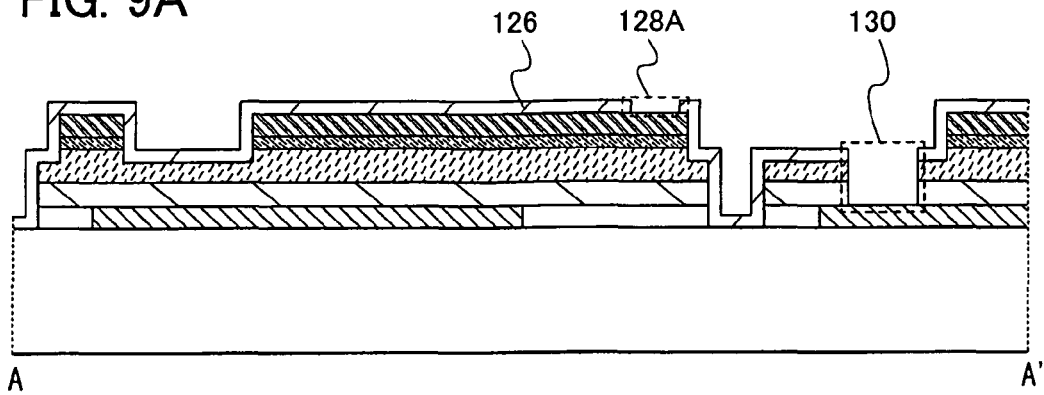
FIGS. 9A to 9C are drawings showing an example of a method for manufacturing thin film transistors and a display device.
Figure 9B:
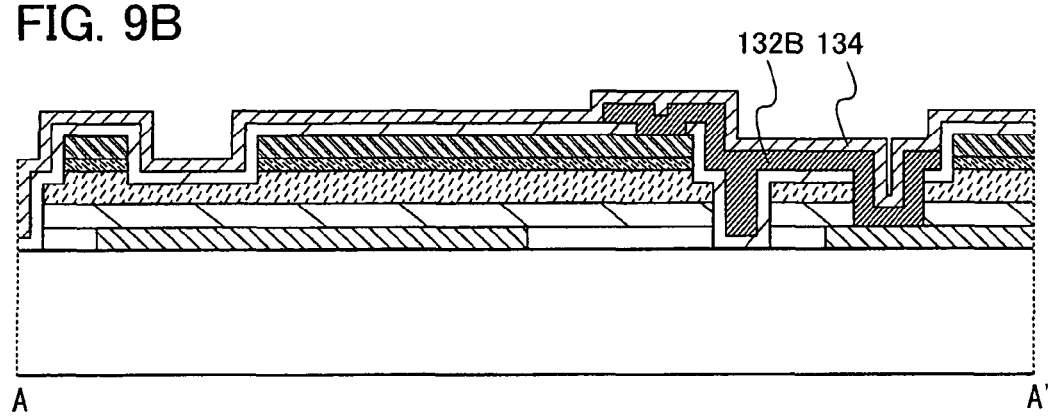
Figure 9C:
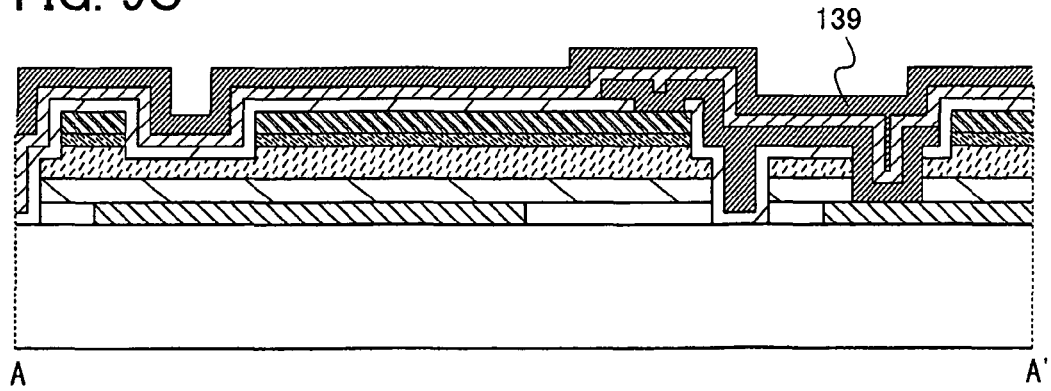
Figure 11A:
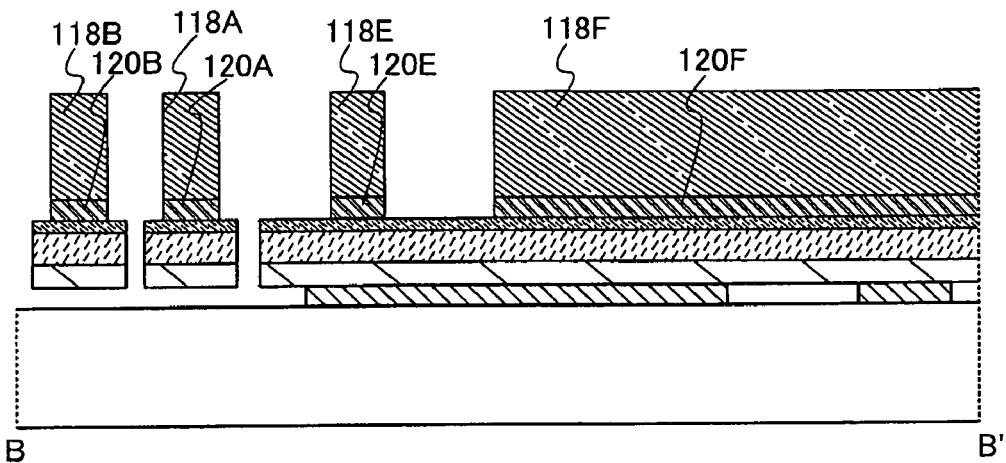
FIGS. 11A to 11C are drawings showing an example of a method for manufacturing thin film transistors and a display device.
Figure 11B:
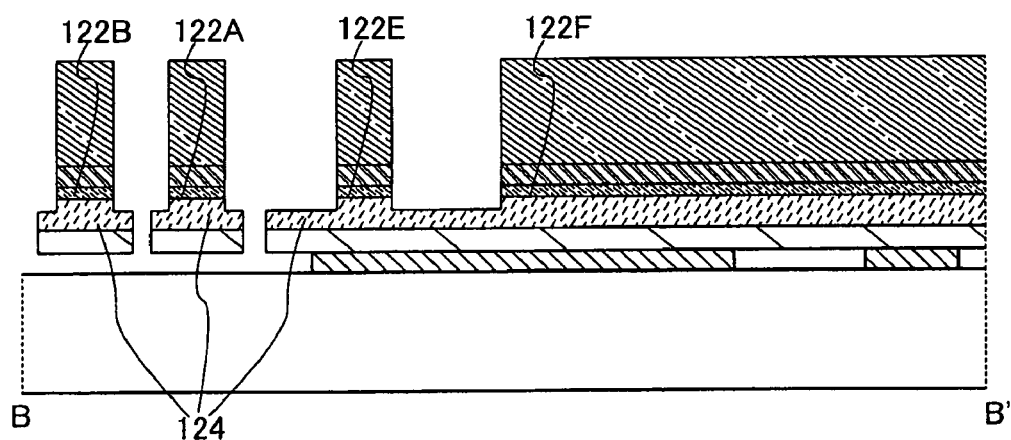
Figure 11C:
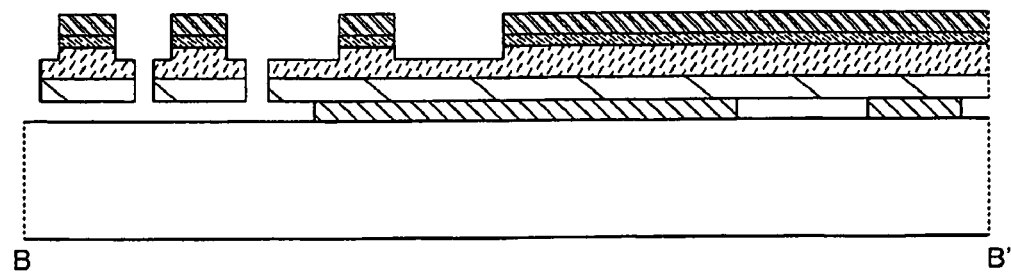
Figure 12A:
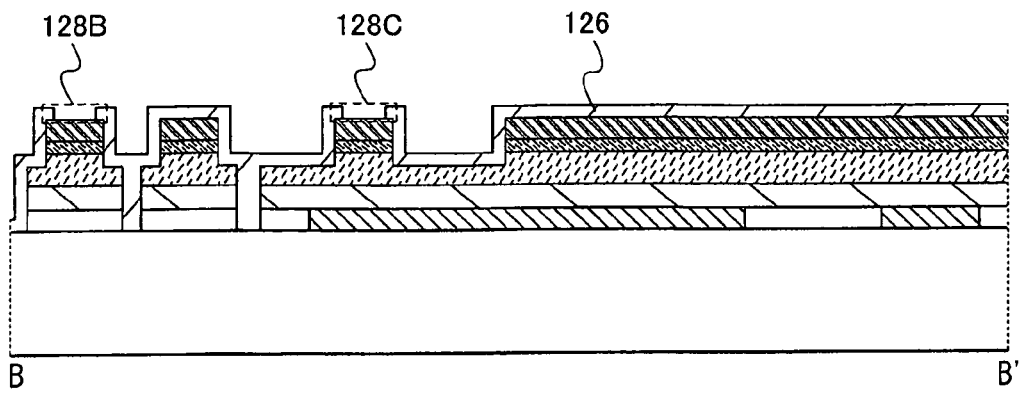
FIGS. 12A to 12C are drawings showing an example of a method for manufacturing thin film transistors and a display device.
Figure 12B:
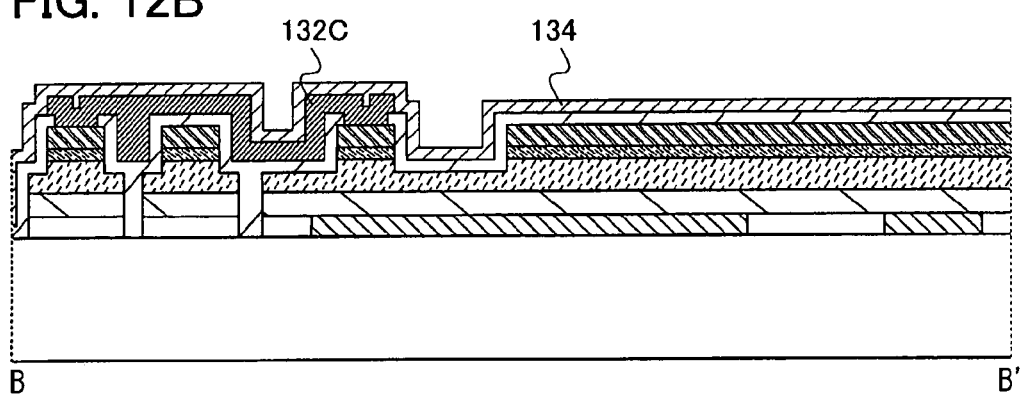
Figure 12C:
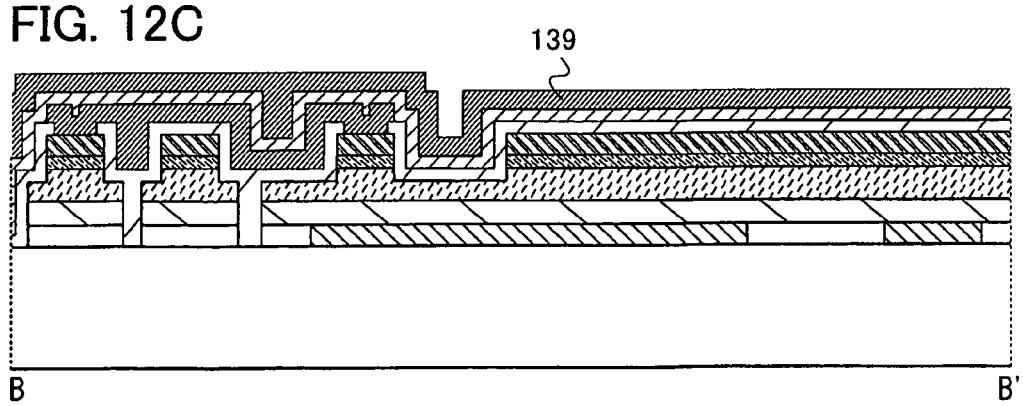

In this specification, the step which has been described with reference to FIGS. 8A, 8B, and the like is called the "third etching." The third etching may be performed by either a plurality of steps or only one step.

A second insulating film 126 is formed to cover the thin film transistors formed as described above. The second insulating film 126 can be formed in a similar manner to the first insulating film 104.

Subsequently, a first opening portion 128 and a second opening portion 130 are formed in the second insulating film (see FIGS. 6, 9A, 12A, and 15A). The first opening portion 128 is formed so as to reach at least a surface of the source electrode and drain electrode layer. The second opening portion 130 is formed so as to reach at least a surface of the gate electrode layer. A method for forming the first opening portion 128 and the second opening portion 130 is not limited to a particular one, and a practitioner may select an appropriate method according to a diameter of the first opening portion 128 or the like. The first opening portion 128 and the second opening portion 130 can be formed by dry etching by a photolithography method, for example.

The first opening portion 128 is formed so as to reach the source electrode and drain electrode layer 120; as shown in FIG. 6, a plurality of first opening portions 128 are provided at appropriate portions. A first opening portion 128A is provided over the source electrode and drain electrode layer 120C; a first opening portion 128B is provided over the source electrode and drain electrode layer 120B; a first opening portion 128C is provided over the source electrode and drain electrode layer 120E.

The second opening portion 130 is provided so as to reach the gate electrode layer 116. That is, the second opening portion 130 is formed by removing a desired portion not only of the second insulating film but also of the first insulating film 104 and the semiconductor layer 124.

Next, a first pixel electrode layer 132 is selectively formed over the second insulating film 126 (see FIGS. 6, 9B, 12B, and 15B). The first pixel electrode layer 132 is formed so as to be connected to the source electrode and drain electrode layer 120 and the gate electrode layer 116 through the first opening portion 128 and the second opening portion 130, respectively. Specifically, the first pixel electrode layer 132 is formed so as to be connected to the source electrode and drain electrode layer 120C, the source electrode and drain electrode layer 120B, the source electrode and drain electrode layer 120E, and the gate electrode layer 116B through the first opening portion 128A, the first opening portion 128B, the first opening portion 128C, and the second opening portion 130, respectively.

In this embodiment mode, it is preferable to use a cathode material for the first pixel electrode layer 132 because the thin film transistors provided for the pixel are n-channel TFTs. Specifically, a material with a low work function, such as Ca, Al, CaF, MgAg, or AlLi may be used.

Subsequently, a third insulating film 134 is formed to cover the first pixel electrode layer 132. The third insulating film 134 has an opening portion 136, and the first pixel electrode layer 132 is exposed in the opening portion 136 (see FIGS. 6, 9C, 12C, and 15C). The opening portion 136 may be formed, for example, by forming the third insulating film 134 in a similar manner to the first insulating film 104 and the second insulating film 126 and then performing etching.

Then, an EL layer 138 is formed so as to be in contact with the first pixel electrode layer 132 in the opening portion 136. The EL layer 138 may be formed using a single layer or by stacking a plurality of layers. The EL layer 138 has at least a light-emitting layer.

EL elements are broadly classified into two types according to whether a light-emitting material used in a light-emitting layer is an organic compound or an inorganic compound: in general, the former is referred to as an organic EL element and the latter is referred to as an inorganic EL element.

In an organic EL element, a voltage is applied to the light-emitting element, so that electrons and holes are injected from a pair of electrodes into a layer containing a light-emitting organic compound and there flows electric current. The light-emitting organic compound is placed in an excited state, and emits light in returning to a ground state from the excited state. Because of such mechanism, such a light-emitting element is also called a "light-emitting element of a current excitation type."

Inorganic EL elements are classified into dispersive inorganic EL elements and thin film inorganic EL elements. A dispersive inorganic EL element includes a light-emitting layer in which particles of a light-emitting material are dispersed in a binder, and light emission mechanism thereof is donor-acceptor recombination light emission, in which a donor level and an acceptor level are utilized. In a thin film inorganic EL element, a light-emitting layer is sandwiched between dielectric layers, and further, the dielectric layers are sandwiched between electrodes. Light emission mechanism of the thin film inorganic EL element is local light emission, in which inner-shell electron transition of a metal atom is utilized.

Although an example of using an organic compound as a light-emitting material (an example of an organic EL element) is presented here, a mode of the invention disclosed is not limited thereto.

Next, a second pixel electrode layer 139 is formed using an anode material so as to cover the EL layer 138 (see FIGS. 6, 9C, 12C, and 15C). The second pixel electrode layer 139 corresponds to the common electrode 20 shown in FIG. 1. The second pixel electrode layer 139 can be formed using a conductive material having a light-transmitting property. Examples of the conductive material having a light-transmitting property include indium tin oxide (hereinafter, also referred to as "ITO"), indium oxide containing tungsten oxide, indium zinc oxide containing tungsten oxide, indium oxide containing titanium oxide, indium tin oxide containing titanium oxide, indium zinc oxide, indium tin oxide to which silicon oxide is added, and the like. A film of the conductive material having a light-transmitting property may be formed by a sputtering method, a CVD method, or the like; however, there is no particular limitation.

In this embodiment mode, ITO is used for the second pixel electrode layer 139. The first pixel electrode layer 132, the EL layer 138, and the second pixel electrode layer 139 overlap with one another in the opening portion 136, thereby forming the light-emitting element. The light-emitting element corresponds to the light-emitting element 15 shown in FIG. 1. After that, it is preferable to form a protective film over the second pixel electrode layer 139 so that oxygen, hydrogen, carbon dioxide, moisture, and the like cannot enter the light-emitting element. As the protective film, a silicon nitride film, a silicon nitride oxide film, a DLC film, or the like can be used.

After that, it is preferable to perform further packaging (sealing) with a protective film (an attachment film, an ultraviolet curable resin film, or the like) or a cover material. It is preferable to use a material which has high airtightness and causes little degasification for the protective film or the cover material.

Through the above process, the light-emitting element of an EL display device with a top emission structure can be formed. Note that a mode of the invention disclosed is not limited to the above description, and can also be applied to EL display devices with a bottom emission structure and a dual emission structure. In the bottom emission structure and the dual emission structure, a conductive material having a light-transmitting property is used for the first pixel electrode layer 132. In addition, it is preferable that the first pixel electrode layer 132 is an anode and the second pixel electrode layer 139 is a cathode, when a pixel portion of an EL display device is formed by using the circuit shown in FIG. 1.

Although the description is made here on an organic EL element as an example of a light-emitting element, it is also possible to provide an inorganic EL element as a light-emitting element.

Next, a terminal connection portion of an active matrix substrate manufactured through the above process is described with reference to FIG. 17, FIG. 18, and FIGS. 19A to 19C.

FIG. 17, FIG. 18, and FIGS. 19A to 19C are a top view, a cross-sectional view, and cross-sectional views, respectively, of a terminal connection portion on the gate wiring side and a terminal connection portion on the source wiring side of the active matrix substrate manufactured through the above process.

Figure 17:
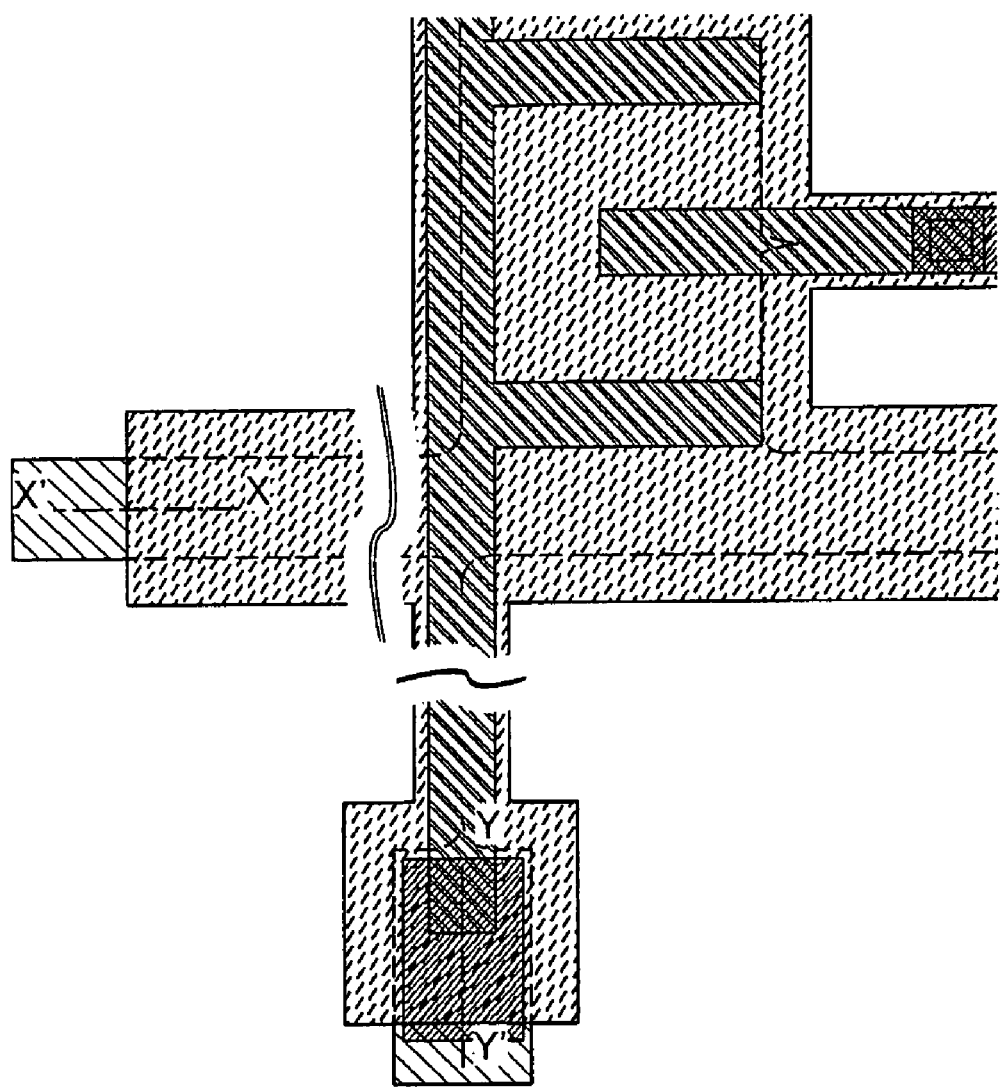
FIG. 17 is a drawing showing a connection portion of an active matrix substrate.

FIG. 17 is a top view of the gate wiring and the source wiring, which extend from a pixel portion, in the terminal connection portion on the gate wiring side and the terminal connection portion on the source wiring side. Terminal connection portions of the first power supply line and the second power supply line can also have a similar structure to that of the source wiring.

Figure 18:
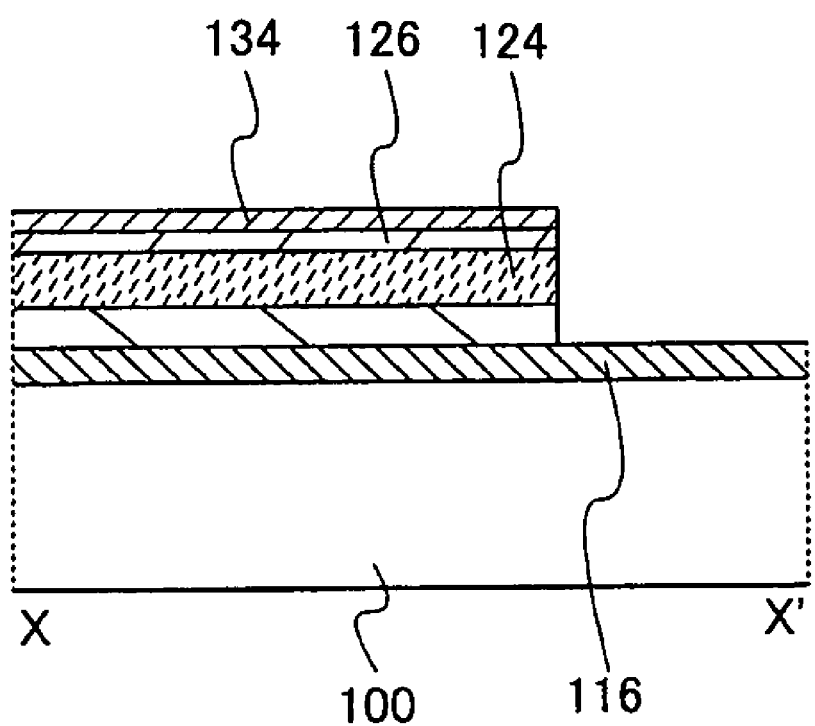
FIG. 18 is a drawing showing a connection portion of an active matrix substrate.

FIG. 18 is a cross-sectional view taken along a line X-X' in FIG. 17. That is, FIG. 18 is a cross-sectional view of the terminal connection portion on the gate wiring side. In FIG. 18, only the gate electrode layer 116 is exposed. A terminal portion is connected to the exposed region of the gate electrode layer 116.

Figure 19A:
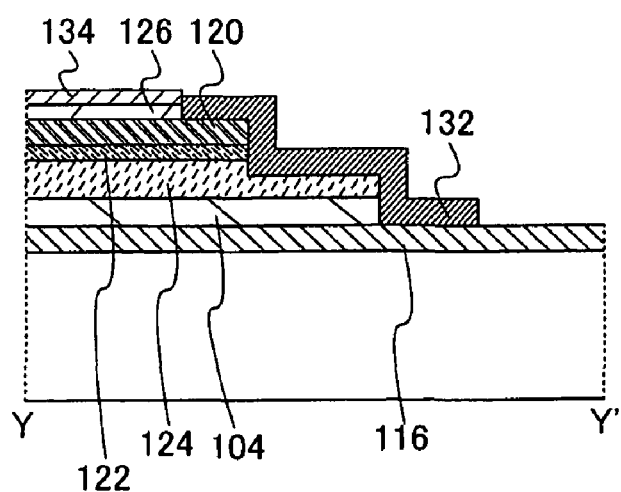
FIGS. 19A to 19C are drawings showing a connection portion of an active matrix substrate.
Figure 19B:
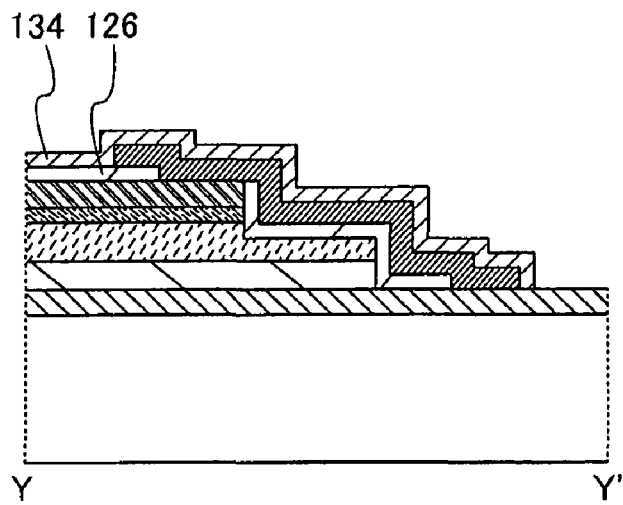
Figure 19C:
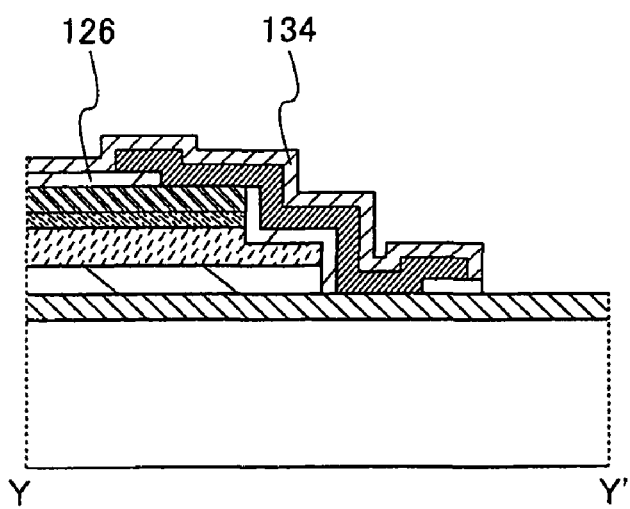

FIGS. 19A to 19C are cross-sectional views taken along a line Y-Y' in FIG. 17. That is, FIGS. 19A to 19C are cross-sectional views of the terminal connection portion on the source wiring side. In the line Y-Y' in FIGS. 19A to 19C, the gate electrode layer 116 is connected to the source electrode and drain electrode layer 120 through the first pixel electrode layer 132 (the same layer as at least the first pixel electrode layer 132A, the first pixel electrode layer 132B, or the first pixel electrode layer 132C). FIGS. 19A to 19C show various modes of connection between the gate electrode layer 116 and the source electrode and drain electrode layer 120. For a terminal connection portion of the display device according to the invention disclosed, any of the modes shown in FIGS. 19A to 19C, or another connection mode may be employed. By connecting the source electrode and drain electrode layer 120 to the gate electrode layer 116, heights of terminal connection portions can be uniform or almost uniform.

The number of opening portions is not limited to that shown in FIGS. 19A to 19C. Instead of providing one opening portion for one terminal, a plurality of opening portions may be provided for one terminal. By providing a plurality of opening portions for one terminal, even if an opening portion is not favorably formed because of inadequate etching for forming the opening portions, electric connection can be achieved through another opening portion; further, if all the opening portions are formed without any problem, a larger connection area can be obtained and contact resistance can be reduced. Thus, it is preferable to provide a plurality of opening portions for one terminal.

In FIG. 19A, an end portion of the second insulating film 126 and the third insulating film 134 is removed by etching or the like to expose the gate electrode layer 116 and the source electrode and drain electrode layer 120, and the first pixel electrode layer 132 (the same layer as at least the first pixel electrode layer 132C) is provided in the exposed region, whereby electric connection is achieved. FIG. 17 is a top view of FIG. 19A.

The exposed region of the gate electrode layer 116 and the source electrode and drain electrode layer 120 can be formed in a similar manner to the first opening portion 128 and the second opening portion 130.

In FIG. 19B, an opening portion is provided in the second insulating film 126 to expose the gate electrode layer 116 and the source electrode and drain electrode layer 120, and the first pixel electrode layer 132 (the same layer as at least the first pixel electrode layer 132C) is formed in the exposed region, whereby electric connection is achieved. Further, the third insulating film 134 is formed to cover the first pixel electrode layer 132, and an end portion of the third insulating film 134 is removed by etching or the like.

The above opening portion can be formed in a similar manner to the first opening portion 128.

In FIG. 19C, an opening portion is provided in the second insulating film 126 to expose the gate electrode layer 116 and the source electrode and drain electrode layer 120, and the first pixel electrode layer 132 (the same layer as at least the first pixel electrode layer 132C) is formed in the exposed region, whereby electric connection is achieved. As in FIGS. 19A and 19B, an end portion of the second insulating film 126 and the third insulating film 134 is removed by etching or the like. This region is used as a terminal connection portion.

The opening portion and the exposed region of the gate electrode layer 116 can be formed in a similar manner to the first opening portion 128 and the second opening portion 130.

An input terminal in the terminal portion (the exposed region of the gate electrode layer 116 in FIGS. 19A to 19C) is connected to a flexible printed circuit (FPC). With regard to the FPC, a wiring is formed using a conductive film over an organic resin film such as polyimide. The FPC is connected to the input terminal through an anisotropic conductive paste (hereinafter referred to as an "ACP"). The ACP contains a paste that functions as an adhesive, and particles that are plated with gold or the like, have diameters of several tens of micrometers to several hundreds of micrometers, and have conductive surfaces. The particles mixed in the paste come to be in contact with a conductive layer over the input terminal and with a terminal connected to the wiring provided for the FPC, whereby electric connection can be achieved.

In the above manner, the EL display device can be manufactured.

According to a mode of the invention disclosed, the number of steps involved in manufacturing a thin film transistor can be reduced significantly. That is, a process of manufacturing a light-emitting device can be simplified. According to a mode of the invention disclosed, electric characteristics can be maintained, and further, the number of steps involved in manufacturing a thin film transistor can be reduced. Thus, an EL display device with high performance can be provided at low cost.

Further, the number of steps for manufacturing a thin film transistor can be reduced significantly without complicated steps such as backside light exposure, resist reflow, lift-off, and the like. Therefore, a yield is improved compared with a process involving the above complicated step or the like.

Furthermore, by forming EL layers selectively by a printing method, an inkjet method, or the like, the EL layers can be formed separately with projections and depressions due to thin film transistors or the like (e.g. a projection and a depression due to a source wiring) utilized; thus, accuracy of forming the EL layers is improved. That is, the accuracy of forming the EL layers can be improved and the efficiency of manufacturing a light-emitting device can be improved without employing a special structure.

Embodiment Mode 2

Figure 20A:
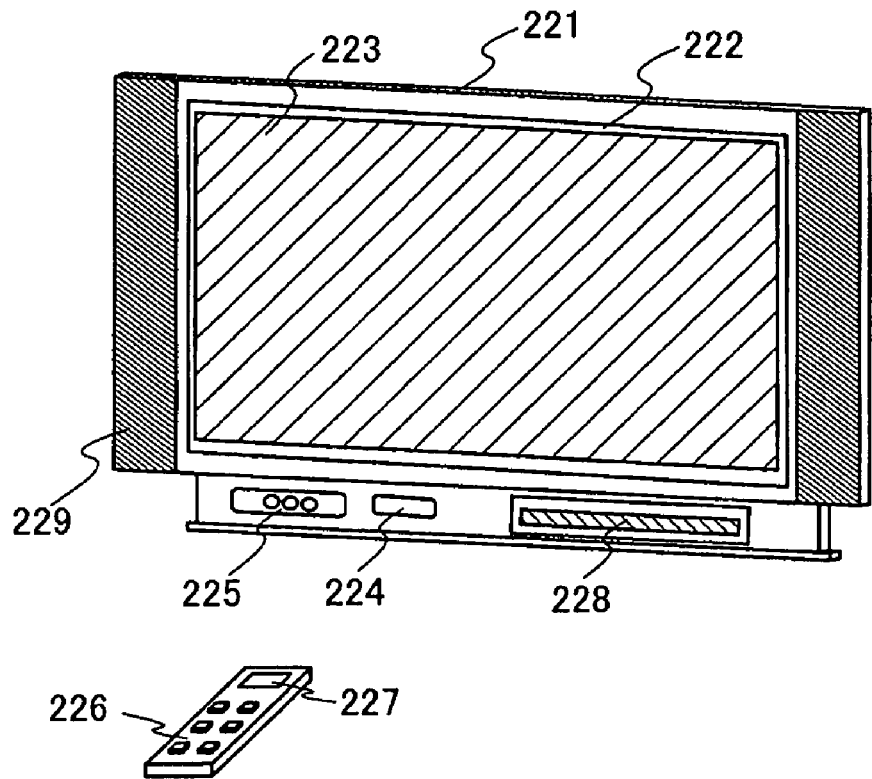
FIGS. 20A and 20B are perspective views showing electronic appliances having display devices.
Figure 20B:
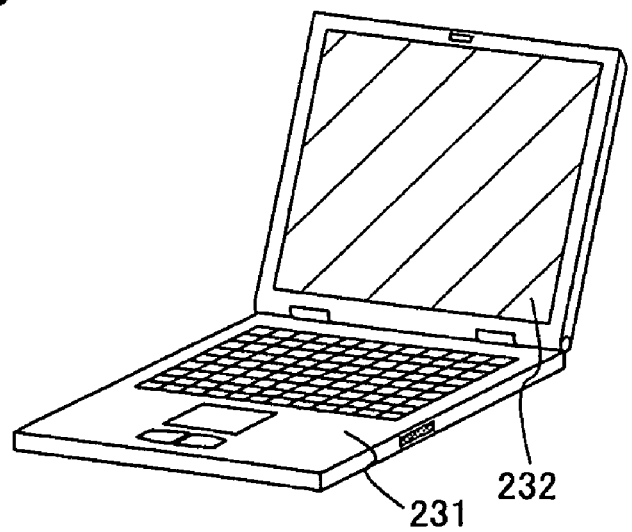

This embodiment mode describes electronic appliances in which display panels or display devices manufactured by a method described in Embodiment Mode 1 are incorporated in display portions, with reference to FIGS. 20A and 20B, FIG. 21, and FIGS. 22A to 22C. Examples of such electronic appliances include cameras such as video cameras and digital cameras, head mount displays (goggle displays), car navigation systems, projectors, car audio component stereos, personal computers, portable information terminals (e.g. mobile computers, mobile phones, and electronic books), and the like. FIGS. 20A and 20B show some examples of these electronic appliances.

FIG. 20A shows a television device. The television device shown in FIG. 20A can be completed by incorporating a display panel manufactured according a mode of the invention disclosed into a chassis. A main screen 223 is formed using a display panel manufactured according to a method described in Embodiment Mode 1. In addition, a speaker portion 229, operation switches, and the like are provided as accessory equipment.

As shown in FIG. 20A, a display panel 222 manufactured according to a method described in Embodiment Mode 1 is incorporated in a chassis 221. With the use of a receiver 225, in addition to reception of general television broadcast, simplex (from a transmitter to a receiver) or duplex (between a transmitter and a receiver or between receivers) communication of information can be performed by connection to a wired or wireless communication network through a modem 224. The television device can be operated with the switches incorporated in the chassis or with a remote controller 226, which is provided separately. A display portion 227 for displaying information to output may also be provided in this remote controller 226.

Further, in the television device, a subscreen 228 may be formed using a second display panel and may be used to display a channel number, volume, and the like, in addition to the main screen 223.

Figure 21:
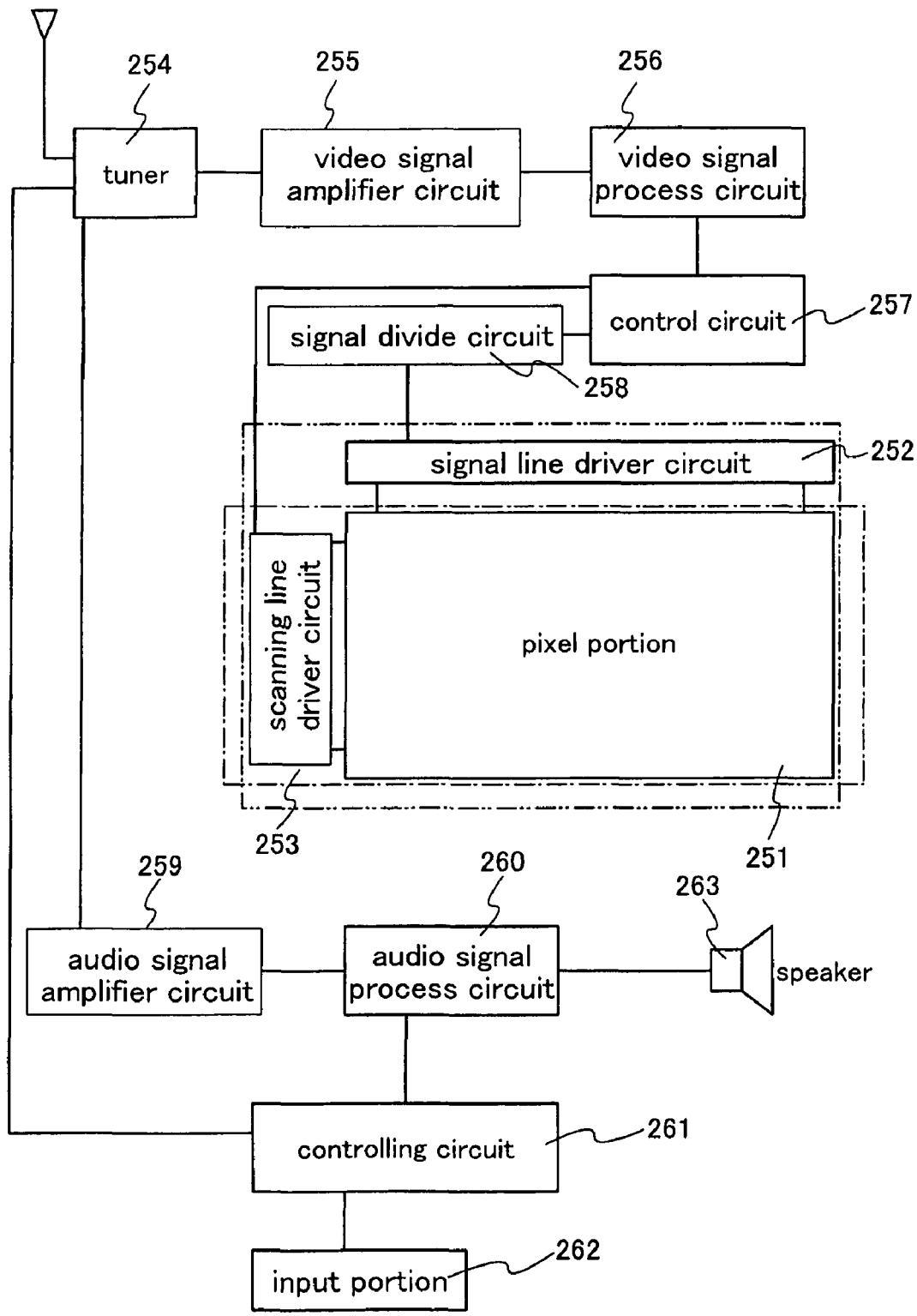
FIG. 21 is a drawing showing an electronic appliance having a display device.

FIG. 21 is a block diagram showing a main structure of a television device. A pixel portion 251 is formed in a display panel 250. A signal line driver circuit 252 and a scanning line driver circuit 253 may be mounted on the display panel 250 by a COG method.

As other external circuits, a video signal amplifier circuit 255 that amplifies a video signal among signals received by a tuner 254, a video signal process circuit 256 that converts the signals output from the video signal amplifier circuit 255 into color signals corresponding to their respective colors of red, green, and blue, a control circuit 257 that converts the video signal so that the video signal can conform with input specification of a driver IC, and the like are provided on a video signal input side. The control circuit 257 outputs signals to both a scanning line side and a signal line side. In a case of digital driving, a signal divide circuit 258 may be provided on the signal line side and an input digital signal may be divided into m pieces (m is an optional integer) and supplied.

An audio signal among signals received by the tuner 254 is sent to an audio signal amplifier circuit 259 and is output to a speaker 263 through an audio signal process circuit 260. A controlling circuit 261 receives control information of a receiving station (reception frequency) or sound volume from an input portion 262, and transmits signals to the tuner 254 and the audio signal process circuit 260.

Needless to say, a mode of the invention disclosed is not limited to a use for television devices, and can be applied to a variety of applications such as monitors of personal computers and display media having a large area (e.g. information display boards in railway stations, airports, and the like, and street-side advertisement display boards). By applying a mode of the invention disclosed to such display media, productivity thereof can be improved.

The main screen 223 and the subscreen 228 are formed using a display panel or a display device manufactured according to a method for manufacturing a display device which is described in Embodiment Mode 1, whereby productivity of the television device can be enhanced.

A portable computer shown in FIG. 20B includes a main body 231, a display portion 232, and the like. A display panel or a display device manufactured according to a method for manufacturing a display device which is described in Embodiment Mode 1 is applied to the display portion 232, whereby productivity of the computer can be enhanced.

Figure 22A:
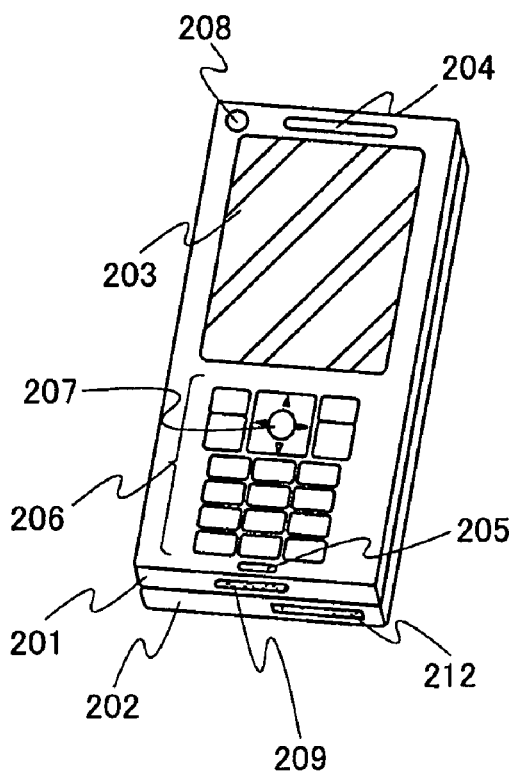
FIGS. 22A to 22C are drawings showing an electronic appliance having a display device.
Figure 22B:
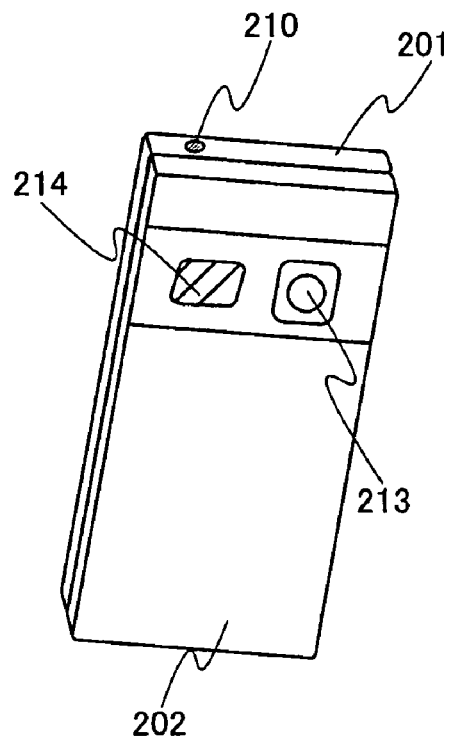
Figure 22C:
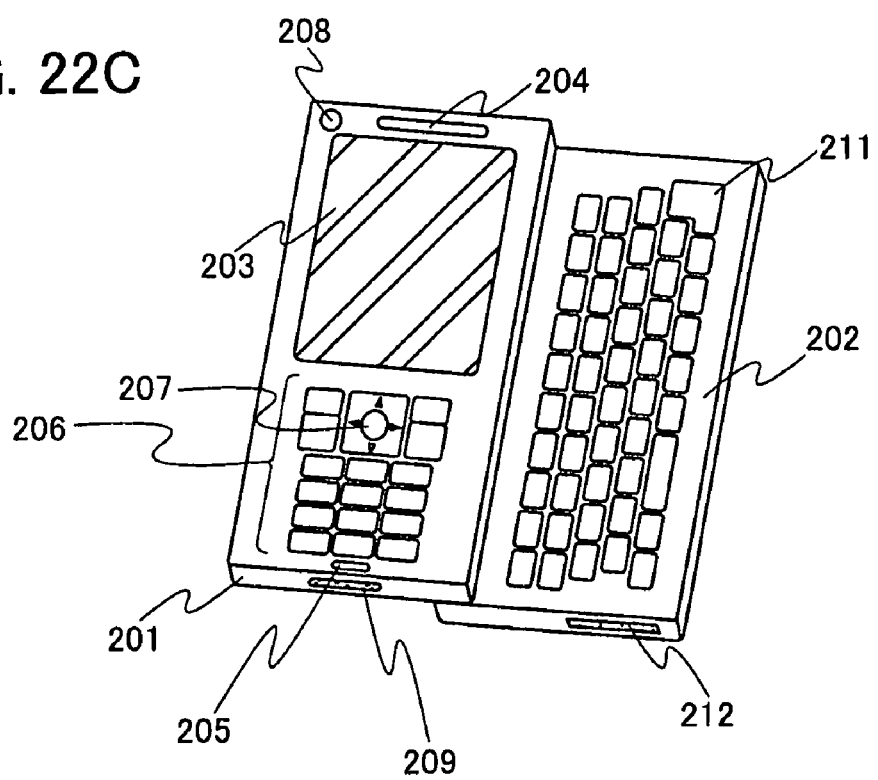

FIGS. 22A to 22C show an example of a mobile phone to which a mode of the invention disclosed is applied. FIG. 22A is a front view, and FIG. 22B is a rear view, and FIG. 22C is a front view in which two chassis are slid out. A mobile phone 200 has two chassis 201 and 202. The mobile phone 200 has both functions of a mobile phone and of a portable information terminal, incorporates a computer, and enables various kinds of data processing in addition to telephone conversation; the mobile phone 200 is a "smartphone."

The chassis 201 is provided with a display portion 203, a speaker 204, a microphone 205, operation keys 206, a pointing device 207, a front camera lens 208, a jack 209 for an external connection terminal, an earphone terminal 210, and the like. The chassis 202 is provided with a keyboard 211, an external memory slot 212, a rear camera 213, a light 214, and the like. In addition, an antenna is incorporated in the chassis 201.

In addition to the above structure, the mobile phone 200 may incorporate a non-contact IC chip, a small memory device, and the like.

The chassis 201 and 202 which overlap with each other (see FIG. 22A) are slid out as shown in FIG. 22C. A display panel or a display device manufactured according to a method for manufacturing a display device which is described in Embodiment Mode 1 can be incorporated in the display portion 203. Since the display portion 203 and the front camera lens 208 are provided on the same face, the mobile phone 200 can be used as a videophone. Further, a still image and a moving image can be taken with the rear camera 213 and the light 214, with the display portion 203 used as a viewfinder.

With the use of the speaker 204 and the microphone 205, the mobile phone 200 can be used as an audio recording device (recording device) or an audio reproducing device. With the use of the operation keys 206, further, operations of incoming and outgoing of calls, simple information input such as electronic mail, scrolling of a display screen in the display portion, cursor movement, e.g. for selecting information to display in the display portion, and the like are possible.

If much information is treated in documentation, a use as a portable information terminal, and the like, it is convenient to use the keyboard 211. The chassis 201 and 202 which overlap with each other (see FIG. 22A) can be slid out as shown in FIG. 22C. When the mobile phone 200 is used as a portable information terminal, a cursor can be moved smoothly with the use of the keyboard 211 and the pointing device 207. The jack 209 for an external connection terminal can be connected to an AC adapter or a variety of cables such as a USB cable, and charging and data communication with a personal computer or the like is possible. Further, by inserting a recording medium in the external memory slot 212, a larger amount of data can be stored and transferred.

The rear face of the chassis 202 (see FIG. 22B) is provided with the rear camera 213 and the light 214, and a still image and a moving image can be taken with the display portion 203 used as a viewfinder.

Further, the mobile phone 200 may have an infrared communication function, a USB port, a function of receiving one segment television broadcast, a non-contact IC chip, an earphone jack, or the like, in addition to the above functions and structures.

A variety of electronic appliances presented in this embodiment mode can be manufactured with application of a method for manufacturing a thin film transistor and a display device which is described in Embodiment Mode 1. Thus, by applying a mode of the invention disclosed, productivity of these electronic appliances can be improved.

By applying a mode of the invention disclosed, cost of manufacturing these electronic appliances can be reduced.

This application is based on Japanese Patent Application serial No. 2008-108193 filed with Japan Patent Office on Apr. 17, 2008, the entire contents of which are hereby incorporated by reference.

What is claimed is:

1. A method for manufacturing a light-emitting device, comprising the steps of:
   forming a first conductive film over an insulating surface;
   forming a first insulating film over the first conductive film;
   forming a semiconductor film over the first insulating film;
   forming an impurity semiconductor film over the semiconductor film;
   forming a second conductive film over the impurity semiconductor film;
   forming a first resist mask over the second conductive film;
   performing first etching on the first conductive film, the first insulating film, the semiconductor film, the impurity semiconductor film, and the second conductive film using the first resist mask to expose the first conductive film;
   performing second etching on a part of the first conductive film to form a gate electrode layer so that a width of the gate electrode layer becomes smaller than a width of the first insulating film;
   removing the first resist mask after the second etching;
   forming a second resist mask after the removing the first resist mask;
   performing third etching on the second conductive film, the impurity semiconductor film, and a part of the semiconductor film using the second resist mask, to form a source electrode layer and a drain electrode layer, a source region layer and a drain region layer, and a semiconductor layer;
   removing the second resist mask;
   forming a second insulating film to cover the source electrode layer and the drain electrode layer, the source region layer and the drain region layer, and the semiconductor layer after removing the second resist mask;
   forming a first opening portion in the second insulating film;
   selectively forming a first pixel electrode layer electrically connected to one of the source electrode layer and the drain electrode layer through the first opening portion in the second insulating film;
   forming a third insulating film to cover the second insulating film and the first pixel electrode layer;
   forming a second opening portion by removing a part of the third insulating film which overlaps with the first pixel electrode layer; and
   selectively forming an EL layer over the first pixel electrode layer in the second opening portion,
   wherein the third insulating film includes a portion that is closer to the insulating surface than the second conductive film and includes the second opening portion.

2. A method for manufacturing a light-emitting device, comprising the steps of:
   forming a first conductive film over an insulating surface;
   forming a first insulating film over the first conductive film;
   forming a semiconductor film over the first insulating film;
   forming an impurity semiconductor film over the semiconductor film;
   forming a second conductive film over the impurity semiconductor film;
   forming a first resist mask having a depressed portion, over the second conductive film;

performing first etching on the first insulating film, the semiconductor film, the impurity semiconductor film, and the second conductive film using the first resist mask to expose the first conductive film;

performing second etching on a part of the first conductive film to form a gate electrode layer so that a width of the gate electrode layer becomes smaller than a width of the first insulating film;

forming a second resist mask by making the first resist mask recede to expose a region of the second conductive film which overlaps with the depressed portion of the first resist mask;

performing third etching on the second conductive film, the impurity semiconductor film, and a part of the semiconductor film using the second resist mask to form a source electrode layer and a drain electrode layer, a source region layer and a drain region layer, and a semiconductor layer;

removing the second resist mask;

forming a second insulating film to cover the source electrode layer and the drain electrode layer, the source region layer and the drain region layer, and the semiconductor layer after removing the second resist mask;

forming a first opening portion in the second insulating film;

selectively forming a first pixel electrode layer electrically connected to one of the source electrode layer and the drain electrode layer through the first opening portion in the second insulating film;

forming a third insulating film to cover the second insulating film and the first pixel electrode layer;

forming a second opening portion by removing a part of the third insulating film which overlaps with the first pixel electrode layer; and selectively forming an EL layer over the first pixel electrode layer in the second opening portion, wherein the third insulating film includes a portion that is closer to the insulating surface than the second conductive film and includes the second opening portion.

3. The method for manufacturing a light-emitting device according to claim 1, wherein the third insulating film extends beyond an end portion of the second conductive film and an end portion of the impurity semiconductor film such that the portion that is closer to the insulating surface than the second conductive film and includes the second opening portion is located beyond the end portion of the second conductive film and beyond the end portion of the impurity semiconductor film.

4. The method for manufacturing a light-emitting device according to claim 2, wherein the third insulating film extends beyond an end portion of the second conductive film and an end portion of the impurity semiconductor film such that the portion that is closer to the insulating surface than the second conductive film and includes the second opening portion is located beyond the end portion of the second conductive film and beyond the end portion of the impurity semiconductor film.

5. The method for manufacturing a light-emitting device according to claim 2, wherein the first resist mask is formed using a multi-tone photomask.

6. The method for manufacturing a light-emitting device according to claim 1, wherein the EL layer is selectively formed by a printing method or an inkjet method.

7. The method for manufacturing a light-emitting device according to claim 2, wherein the EL layer is selectively formed by a printing method or an inkjet method.

8. The method for manufacturing a light-emitting device according to claim 1, wherein the gate electrode layer has a side face at an inner position with respect to a side face of the first insulating film.

9. The method for manufacturing a light-emitting device according to claim 2, wherein the gate electrode layer has a side face at an inner position with respect to a side face of the first insulating film.

10. The method for manufacturing a light-emitting device according to claim 1, wherein the first etching is dry etching, and the second etching is wet etching.

11. The method for manufacturing a light-emitting device according to claim 2, wherein the first etching is dry etching, and the second etching is wet etching.

* * * * *